(12) United States Patent
Miyoshi et al.

(10) Patent No.: US 11,296,212 B2
(45) Date of Patent: Apr. 5, 2022

(54) SEMICONDUCTOR DEVICE AND POWER CONVERSION DEVICE

(71) Applicant: Hitachi Power Semiconductor Device, Ltd., Hitachi (JP)

(72) Inventors: Tomoyuki Miyoshi, Tokyo (JP); Mutsuhiro Mori, Tokyo (JP); Tomoyasu Furukawa, Tokyo (JP); Yujiro Takeuchi, Tokyo (JP); Masaki Shiraishi, Tokyo (JP)

(73) Assignee: Hitachi Power Semiconductor Device, Ltd., Hitachi (JP)

( * ) Notice: Subject to any disclaimer, the term of this patent is extended or adjusted under 35 U.S.C. 154(b) by 103 days.

(21) Appl. No.: 16/971,547

(22) PCT Filed: Feb. 1, 2019

(86) PCT No.: PCT/JP2019/003571
§ 371 (c)(1),
(2) Date: Aug. 20, 2020

(87) PCT Pub. No.: WO2019/163478
PCT Pub. Date: Aug. 29, 2019

(65) Prior Publication Data
US 2021/0091217 A1 Mar. 25, 2021

(30) Foreign Application Priority Data

Feb. 23, 2018 (JP) .............................. JP2018-031389

(51) Int. Cl.
*H01L 29/739* (2006.01)
*H01L 25/16* (2006.01)
*H01L 29/06* (2006.01)

(52) U.S. Cl.
CPC .......... *H01L 29/7395* (2013.01); *H01L 25/16* (2013.01); *H01L 29/0619* (2013.01)

(58) Field of Classification Search
CPC .. H01L 29/7395; H01L 25/16; H01L 29/0619
See application file for complete search history.

(56) References Cited

U.S. PATENT DOCUMENTS

| | | | | |
|---|---|---|---|---|
| 5,341,004 A | * | 8/1994 | Furuhata | ............ H03K 17/567 257/139 |
| 5,883,402 A | * | 3/1999 | Omura | ............ H01L 27/0248 257/146 |

(Continued)

FOREIGN PATENT DOCUMENTS

| | | |
|---|---|---|
| JP | 5-291913 A | 11/1993 |
| JP | 6-290863 A | 10/1994 |

(Continued)

OTHER PUBLICATIONS

International Search Report (PCT/ISA/210) issued in PCT Application No. PCT/JP2019/003571 dated May 21, 2019 with English translation (three pages).

(Continued)

*Primary Examiner* — Steven B Gauthier
*Assistant Examiner* — Pavel G Ivanov
(74) *Attorney, Agent, or Firm* — Crowell & Moring LLP

(57) ABSTRACT

A current switching semiconductor device to be used in a power conversion device achieves both a low conduction loss and a low switching loss. The semiconductor device includes the IGBT in which only Gc gates are provided and an impurity concentration of the p type collector layer is high, and the IGBT in which the Gs gates and the Gc gates are provided and an impurity concentration of the p type collector layer is low. When the semiconductor device is turned off, the semiconductor device transitions from a state in which a voltage lower than a threshold voltage is applied to both the Gs gates and the Gc gates to a state in which a (Continued)

voltage equal to or higher than the threshold voltage is applied to the Gc gates prior to the Gs gates.

15 Claims, 27 Drawing Sheets

(56) References Cited

U.S. PATENT DOCUMENTS

| | | | |
|---|---|---|---|
| 9,412,854 B2* | 8/2016 | Felsl | H01L 29/7395 |
| 9,595,602 B2* | 3/2017 | Hashimoto | H01L 29/41708 |
| 2012/0098097 A1* | 4/2012 | Felsl | H01L 29/7395 |
| | | | 257/566 |
| 2015/0144994 A1* | 5/2015 | Sung | H01L 29/4232 |
| | | | 257/139 |
| 2015/0303288 A1* | 10/2015 | Hashimoto | H02M 7/537 |
| | | | 363/131 |
| 2016/0020309 A1* | 1/2016 | Suzuki | H01L 29/7397 |
| | | | 363/131 |
| 2017/0309619 A1 | 10/2017 | Bina et al. | |
| 2018/0248543 A1 | 8/2018 | Senda | |
| 2020/0395471 A1* | 12/2020 | Takeuchi | H01L 29/7393 |

FOREIGN PATENT DOCUMENTS

| | | |
|---|---|---|
| JP | 2011-155289 A | 8/2011 |
| JP | 2017-70051 A | 4/2017 |
| JP | 6228542 B2 | 11/2017 |
| WO | WO 2014/038064 A1 | 3/2014 |

OTHER PUBLICATIONS

Japanese-language Written Opinion (PCT/ISA/237) issued in PCT Application No. PCT/JP2019/003571 dated May 21, 2019 (four pages).

* cited by examiner

NOTE:

―――― { Gs: EQUAL TO OR HIGHER THAN THRESHOLD VOLTAGE
Gc: EQUAL TO OR HIGHER THAN THRESHOLD VOLTAGE

- - - - { Gs: EQUAL TO OR HIGHER THAN THRESHOLD VOLTAGE
Gc: LOWER THAN THRESHOLD VOLTAGE

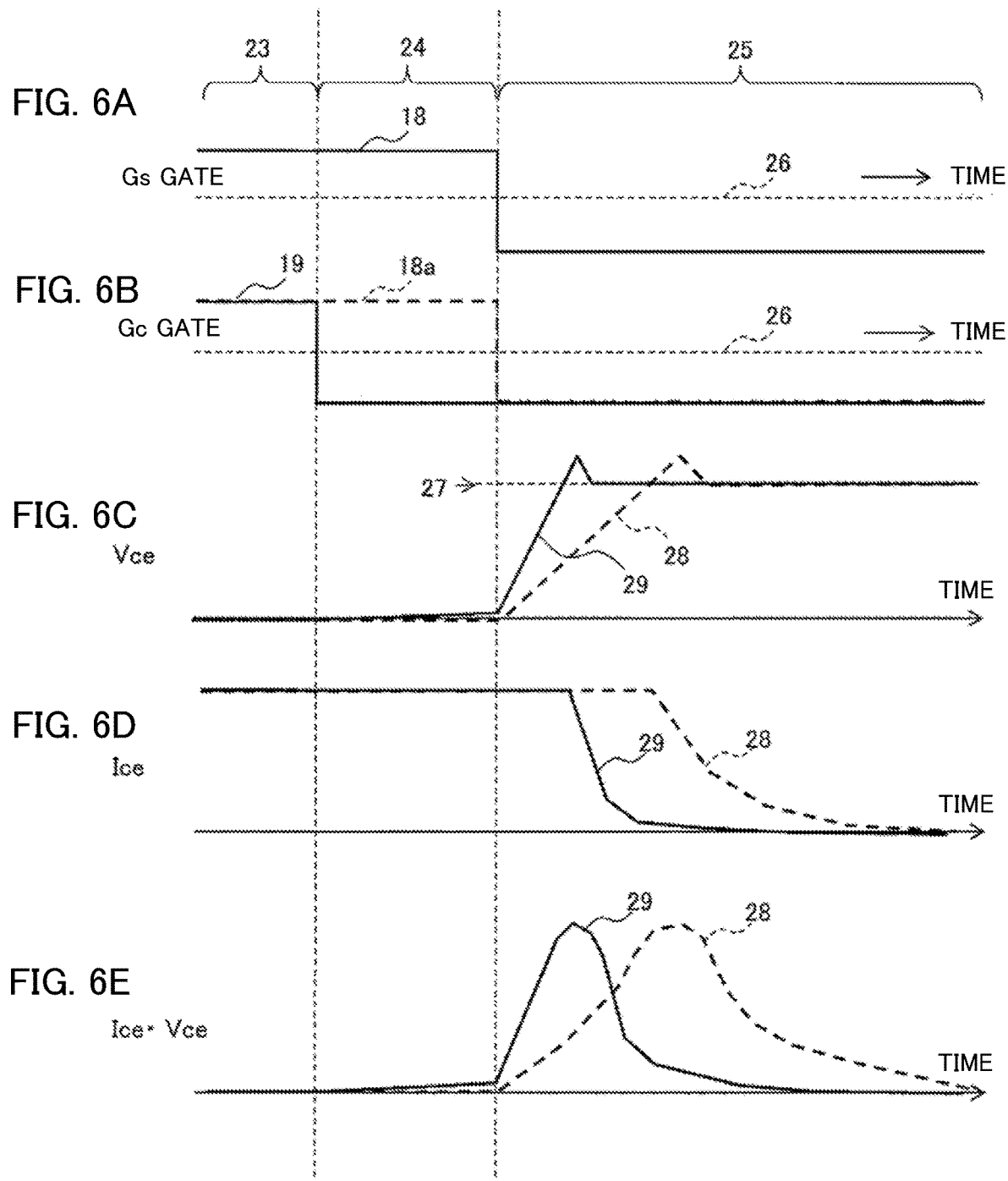

SEMICONDUCTOR DEVICE AND POWER CONVERSION DEVICE

TECHNICAL FIELD

The present invention relates to a semiconductor device suitable for switch controlling a large current, and a power conversion device using the semiconductor device.

BACKGROUND ART

In recent years, global warming has become an important worldwide urgent problem. In order to solve this problem, there are growing expectations for contributing an energy saving technique in a power conversion device that is widely used from a household electrical appliance such as an air conditioner and a microwave oven up to high-power equipment such as an inverter used in railways or ironworks. In most cases, such a power conversion device mainly includes a semiconductor device such as an insulated gate bipolar transistor (IGBT) having a high-power switching function and a diode having a rectification function. Therefore, a new low-power consumption technique is required more than ever in a power semiconductor device such as a high-power IGBT and a diode.

The related art discloses an IGBT including two controllable and independent insulated gates as a technique for reducing a conduction loss and a turn-off loss in the IGBT (for example, see PTL 1).

In addition, the related art discloses a technique for reducing a current at the time of turn-off by connecting in parallel two IGBTs having different collector-emitter voltages during conduction (for example, see PTL 2 or PTL 3).

CITATION LIST

Patent Literature

PTL 1: Japanese Patent No. 6228542
PTL 2: JP-A-H06-290863
PTL 3: JP-A-H05-291913

SUMMARY OF INVENTION

Technical Problem

FIG. 26 is a diagram showing an example of a partial circuit diagram of a general inverter 80 in the related art. The inverter 80 shown in FIG. 26 is an example of a power conversion device that converts a direct current into a three-phase alternating current. The inverter 80 includes six IGBTs 70, six diodes 72, drive circuits 67 that drive insulated gate terminals 71 of the IGBTs 70, and a control circuit 64 that supplies a control signal to each of the drive circuits 67. In the inverter 80, every two IGBTs 70 are connected in series to form a set, and sets are separately connected in parallel to a positive electrode and a negative electrode of a direct current power supply 69. In addition, one diode 72 is connected in antiparallel between a collector and an emitter of each IGBT 70.

In this case, signal voltages having different phases for respectively turning on or turning off the IGBTs 70 are repeatedly applied to the insulated gate terminals 71 of the IGBTs 70. For example, a three-phase alternating current is output from a connection point of two IGBTs 70 connected in series, and is supplied to an inductive load 68 such as a motor.

In general, the IGBTs 70 and the diodes 72 generate a conduction loss during conduction and generate a switching loss at the time of switching. Therefore, it is required to reduce the conduction loss and the switching loss in the IGBTs 70 and the diodes 72 in order to achieve miniaturization, high efficiency, and low power consumption of the inverter 80. Here, the switching loss includes a turn-on loss and a turn-off loss occurring in the IGBTs 70 and a recovery loss occurring in the diodes 72 at the time of turn-on.

PTL 1 discloses an example of an IGBT 101 including two controllable and independent insulated gates as a technique for reducing the conduction loss and the turn-off loss in the IGBTs 70. FIG. 27 is a diagram showing an example of a cross-sectional structure of the IGBT 101 disclosed in PTL 1.

As shown in FIG. 27, the IGBT 101 includes Gs gates 91 and Gc gates 92 that are formed into a trench shape and serve as gate electrodes for controlling a current between a collector electrode 8 and an emitter electrode 7. When a high voltage equal to or higher than a threshold voltage of the emitter electrode 7 is applied to the Gs gates 91 and the Gc gates 92, an electron inversion layer is formed in the vicinity of a gate electrode interface of a p type well layer 2. When a forward voltage is applied between the collector electrode 8 and the emitter electrode 7, electron carriers are injected from the emitter electrode 7 into an n$^-$ type drift layer 1 through the inversion layer formed in the vicinity of the gate electrode interface of the p type well layer 2. As a result, hole carriers flow from a p type collector layer 4 into the n$^-$ type drift layer 1. Accordingly, a conductivity modulation occurs inside the n$^-$ type drift layer 1, and the IGBT 101 becomes conductive.

Next, when a voltage lower than the threshold voltage is applied to the Gs gates 91 and Gc gates 92, carriers that contribute to a conductivity modulation are discharged to the emitter electrode 7 and the collector electrode 8, and the IGBT 101 transitions into a non-conducting state. That is, the IGBT 101 is turned off. At this time, a power loss referred to as a turn-off loss occurs due to a current generated along with a movement of the carriers and a reverse voltage applied to the emitter electrode 7 and the collector electrode 8.

The IGBT 101 (see FIG. 27) includes two controllable and independent gates, that is, the Gs gate 91 and the Gc gate 92 as gate electrodes. When a voltage lower than the threshold voltage is applied to the Gc gate 92 prior to the Gs gate 91 right before the IGBT 101 is turned off, a conductivity modulation is prevented from occurring in the n$^-$ type drift layer 1 in the vicinity of the Gc gate 92. As a result, the n$^-$ type drift layer 1 in which a carrier concentration is reduced can be temporarily achieved. Accordingly, a current caused by discharging carriers from the n$^-$ type drift layer 1 can be reduced at the time of turn-off. In addition, a turn-off loss can be reduced by applying a reverse voltage between the collector electrode 8 and the emitter electrode 7 at a high speed.

As described above, in the IGBT 101 shown in FIG. 27, a concentration of carriers accumulated in the n$^-$ type drift layer can be dynamically adjusted (reduced) by appropriately controlling a voltage applied to the Gs gate 91 and the Gc gate 92 at the time of turn-off. As a result, a turn-off loss of the IGBT 101 can be reduced.

However, a carrier concentration cannot be adjusted across the entire n$^-$ type drift layer 1 in practice. Certainly, the carrier concentration in the n$^-$ type drift layer 1 in the vicinity of the Gs gate 91 and the Gc gate 92 can be reduced by controlling the voltage applied to the Gs gate 91 and the Gc gate 92 as described above. On the other hand, since the n⁻ type drift layer 1 in the vicinity of the p type collector layer 4 is away from the Gc gate 92 in which injection of electron carriers is controlled, an effect of adjusting the carrier concentration by controlling the voltage applied to the Gs gate 91 and the Gc gate 92 cannot be sufficiently obtained.

This means that a control of adjusting the carrier concentration in the n⁻ type drift layer 1 in the vicinity of the p type collector layer 4 at the time of turn-off does not function sufficiently in the IGBT 101 disclosed in PTL 1. A degree of malfunction increases in a high breakdown voltage structure in which a thickness of a semiconductor substrate that forms the IGBT 101 increases, that is, an interval between the p type well layer and the p type collector layer 4 is large. Therefore, a sufficient effect of reducing a turn-off loss cannot be obtained by only controlling the voltage applied to the Gs gate 91 and the Gc gate 92 particularly in the IGBT 101 having a high breakdown voltage.

PTL 2 and PTL 3 disclose a technique for reducing a current at the time of turn-off by connecting in parallel two IGBTs having different collector-emitter voltages during conduction (hereinafter, referred to as ON voltages). FIG. 28 is a diagram showing an example of a power switching circuit using the IGBTs disclosed in PTL 2. Two independent IGBTs 33 and 34 are connected in parallel as elements in the power switching circuit so as to switch power supplied from a direct current power supply 59 to a load including a heating coil 50 and a resonant capacitor 39. The two IGBTs 33 and 34 have different resistances during conduction, that is, ON voltages.

For example, an ON voltage of the IGBT 33 is low and an ON voltage of the IGBT 34 is high. In this case, one having a high impurity concentration (a carrier concentration) in a collector layer (a semiconductor layer corresponding to the p type collector layer 4 in FIG. 27) is used as the IGBT 33 having a low ON voltage. One having a low impurity concentration in a collector layer is used as the IGBT 34 having a high ON voltage. Alternatively, a carrier lifetime control in the n⁻ type drift layer 1 may be used to control the ON voltages. That is, one having a long carrier lifetime in the n⁻ type drift layer 1 is used as the IGBT 33 having a low ON voltage, and one having a short carrier lifetime in the n⁻ type drift layer 1 is used as the IGBT 34 having a high ON voltage.

In the power switching circuit shown in FIG. 28, different voltages are respectively applied to a gate 35 of the IGBT 33 and a gate 36 of the IGBT 34 from a control circuit 38. When voltages equal to or higher than a threshold voltage are respectively applied to the gates 35 and 36, the IGBTs 33 and 34 connected in parallel are conductive at the same time. Therefore, the IGBTs 33 and 34 obtain a low ON voltage as a whole. In a turn-off case, a voltage lower than the threshold voltage is applied to the gate 35 of the IGBT 33 having a low ON voltage prior to the gate 36 of the IGBT 34 having a high ON voltage. In this case, only the IGBT 34 having a high ON voltage is in a conducting state. Since an ON voltage of the IGBTs 33 and 34 connected in parallel increases as a whole, a carrier concentration in the n⁻ type drift layer 1 can be temporarily reduced.

Next, when voltages lower than the threshold voltage are applied to the gate 35 of the IGBT 33 and the gate 36 of the IGBT 34, the IGBTs 33 and 34 are in a non-conducting state at the same time, and carriers in the n⁻ type drift layer 1 are discharged into a collector layer. In this case, the IGBTs 33 and 34 connected in parallel are regarded as a whole, and prior to this case, the carrier concentration in the n⁻ type drift layer 1 is reduced when only the IGBT 34 is in a conducting state. Therefore, a quantity of carriers that are discharged from the n⁻ type drift layer 1 into the collector layer can be reduced. As a result, a turn-off loss of the IGBTs 33 and 34 connected in parallel can be reduced as a whole.

On the other hand, since a carrier concentration at an emitter side in the n⁻ type drift layer 1 cannot be controlled, a turn-off control is performed in a state in which the carrier concentration is high. Therefore, when a collector-emitter voltage transitions to a reverse voltage, a depletion speed inside the n⁻ type drift layer 1 is reduced. That is, since transition time of a voltage change increases, an effect of reducing a turn-off loss is reduced.

As described above, in the IGBT 101 disclosed in PTL 1, a carrier concentration at an emitter electrode 7 side in the n⁻ type drift layer 1 can be temporarily reduced and a carrier concentration at a collector electrode 8 side cannot be reduced at the time of turn-off. Therefore, although a collector-emitter voltage increases at a high speed, it takes time to discharge carriers, and it is difficult to increase a current reducing speed.

In techniques disclosed in PTL 2 and PTL 3, since a carrier concentration in the vicinity of a collector layer in a drift layer of an IGBT can be temporarily reduced, a current reducing speed can be increased at the time of turn-off. However, it is difficult to increase a collector-emitter voltage rising speed. Therefore, an effect of reducing a turn-off loss in these related arts is reduced particularly when a distance between an emitter and a collector, that is, a thickness of the drift layer increases and an IGBT has a high breakdown voltage. In brief, it is difficult to improve a trade-off relationship between a conduction loss and a turn-off loss in an IGBT.

In view of the above problems in the related arts, an object of the invention is to provide a semiconductor device capable of improving the trade-off relationship between the conduction loss and the turn-off loss and achieving a low conduction loss and a low switching loss, and a power conversion device using the semiconductor device.

Solution to Problem

The semiconductor device according to the invention includes a first semiconductor element and a second semiconductor element that are connected in parallel. The first semiconductor element includes a first drift layer of a first conductive type that is formed on a first semiconductor substrate, a first well region of a second conductive type that is in contact with the first drift layer and formed at a first surface side of the first semiconductor substrate, first gate electrodes that are provided in a plurality of trenches formed at the first surface side of the first semiconductor substrate and passing through the first well region such that the first gate electrodes are in contact with the first drift layer and the first well layer via gate insulation films, a first emitter region of a first conductive type that is formed on a part of a surface of the first well region interposed between a plurality of the first gate electrodes such that the first emitter region is in contact with the first gate electrodes via the gate insulation films, a first channel region of a second conductive type that is formed on a surface of the first well region facing the first gate electrodes via the gate insulation films, a first emitter electrode in which the first emitter region and the first well region are electrically connected, a first collector layer of a second conductive type that is in contact with the first drift layer and formed at a second surface side of the first semiconductor substrate, and a first collector electrode that is electrically connected to the first collector layer. The second semiconductor element includes a second drift layer of a first conductive type that is formed on a second semiconductor substrate, a second well region of a second conductive type that is in contact with the second drift layer and formed at a first surface side of the second semiconductor substrate, gate electrode sets each including a second gate electrode and a third gate electrode that are respectively provided in every two adjacent trenches among a plurality of trenches formed at the first surface side of the second semiconductor substrate and passing through the second well region so that the second gate electrode and the third gate electrode are in contact with the second drift layer and the second well region via gate insulation films, a second emitter region of a first conductive type that is formed on a part of a surface of the second well region interposed between the second gate electrode and the third gate electrode that belong to the same set among the gate electrode sets so that the second emitter region is respectively in contact with the second gate electrode and the third gate electrode via the gate insulation films, a second channel region of a second conductive type that is formed on a surface of the second well region facing the second gate electrode via the gate insulation films, a third channel region of a second conductive type that is formed on a surface of the second well region facing the third gate electrode via the gate insulation films, a second emitter electrode that is electrically connected to the second emitter region and the second well region, a second collector layer of a second conductive type that is in contact with the second drift layer and formed at a second surface side of the second semiconductor substrate, and a second collector electrode that is electrically connected to the second collector layer. The first emitter electrode of the first semiconductor element and the second emitter electrode of the second semiconductor element are electrically connected with each other. The first collector electrode of the first semiconductor element and the second collector electrode of the second semiconductor element are electrically connected with each other. A voltage required to cause a predetermined current to flow in the first semiconductor element is smaller than a voltage required to cause the predetermined current to flow in the second semiconductor element. A first gate electrode of the first semiconductor element and the second gate electrode of the second semiconductor element are electrically connected with each other.

Advantageous Effect

According to the invention, provided are the semiconductor device capable of improving a trade-off relationship between a conduction loss and a turn-off loss and achieving a low conduction loss and a low switching loss, and the power conversion device using the semiconductor device.

BRIEF DESCRIPTION OF DRAWINGS

FIGS. 5A to 5C are diagrams showing a carrier concentration distribution and a forward characteristic of a collector-emitter current at the time of turn-on and right before turn-off in a semiconductor device according to the first embodiment as compared with the related arts, wherein FIG. 5A shows an example based on PTL 1, FIG. 5B shows an example based on PTL 2 and PTL 3, and FIG. 5C shows an example based on the first embodiment.

FIGS. 6A to 6E are diagrams showing an example of operation waveforms when the semiconductor device according to the first embodiment is turned off, wherein FIG. 6A shows a Gs gate drive signal waveform, FIG. 6B shows a Gc gate drive signal waveform, FIG. 6C shows a collector-emitter voltage (Vce) waveform, FIG. 6D shows a collector-emitter current (Ice) waveform, and FIG. 6E shows a current and voltage product (Ice·Vce) waveform.

FIGS. 7A to 7C are diagrams showing an example of a collector-emitter voltage and current waveform and a powder loss waveform when the semiconductor device according to the first embodiment is turned off as compared with the related arts, wherein FIG. 7A shows an example based on PTL 1, FIG. 7B shows an example based on PTL 2 and PTL 3, and FIG. 7C shows an example based on the first embodiment.

FIGS. 18A to 18C are diagrams showing configuration examples of a semiconductor device according to a fifth embodiment, wherein FIG. 18A shows an example of a circuit configuration, FIG. 18B shows an example of a planar arrangement configuration, and FIG. 18C shows an example of a cross-sectional configuration.

FIGS. 21A to 21D are diagrams showing an example of operation waveforms when the semiconductor device according to the first embodiment is turned on, wherein FIG. 21A shows a Gc gate drive signal waveform, FIG. 21B shows a Gs gate drive signal waveform, FIG. 21C shows a collector-emitter voltage (Vce) waveform, and FIG. 21D shows a collector-emitter current (Ice) waveform.

FIGS. 22A to 22D are diagrams showing operation waveforms according to a modification when the semiconductor device according to the first embodiment is turned on, wherein FIG. 22A shows a Gc gate drive signal waveform, FIG. 22B shows a Gs gate drive signal waveform, FIG. 22C shows a collector-emitter voltage (Vce) waveform, and FIG. 22D shows a collector-emitter current (Ice) waveform.

DESCRIPTION OF EMBODIMENTS

Figure 1:
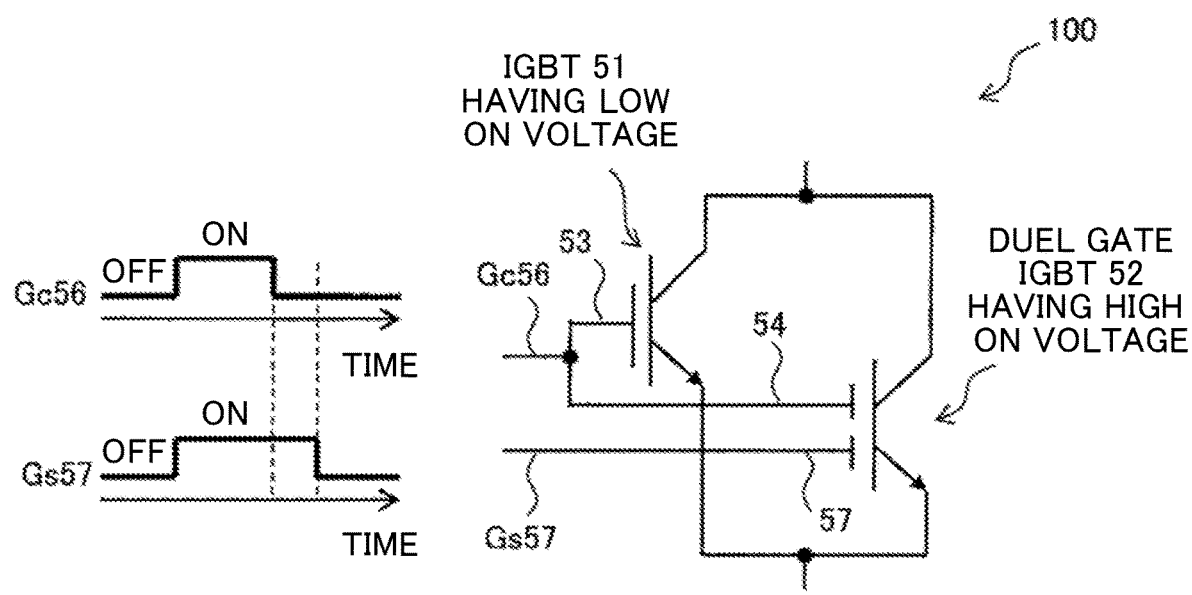
FIG. 1 is a diagram showing an example of a circuit configuration in a semiconductor device according to a first embodiment.

Hereinafter, embodiments of the invention will be described in detail with reference to the drawings. In the drawings, symbols n⁻ and n indicate an n type semiconductor layer and an impurity concentration is relatively high in order of n⁻, n. Symbols p⁻ and p indicate a p type semiconductor layer and an impurity concentration is relatively high in order of p⁻, p. In the drawings, the same components are denoted by the same reference numerals, and a repetitive description thereof will be omitted.

First Embodiment

FIG. 1 is a diagram showing an example of a circuit configuration of a semiconductor device 100 according to the embodiment first embodiment. As shown in FIG. 1, the semiconductor device 100 is implemented by connecting in parallel an IGBT 51 and an IGBT 52 that have different performances from each other. The IGBT 51 has a small voltage drop when a predetermined current flows, that is, a low ON voltage performance. In contrast, the IGBT 52 is a dual gate IGBT that has a high ON voltage performance and includes two independent and controllable gates.

A gate 53 of the IGBT 51 having a low ON voltage and a gate 54 of the dual gate IGBT 52 having a high ON voltage are electrically connected with each other. A same gate control signal Gc 56 is supplied to the gates 53 and 54 that are connected with each other. Hereinafter, the gates 53 and 54 are collectively referred to as a Gc gate 56. In contrast, a gate control signal Gs 57 is applied to the gate 57 of the dual gate IGBT 52 having a high ON voltage. Hereinafter, the gate 57 is referred to as a Gs gate 57.

In the semiconductor device 100 according to the present embodiment, when a voltage equal to or higher than a threshold voltage is applied to both the Gc gate 56 and the Gs gate 57, a conductivity modulation occurs in the IGBTs 51 and 52 at the same time, and a carrier concentration is increased to achieve a low ON voltage. When the semiconductor device 100 is turned off, a voltage lower than the threshold voltage is applied to the Gc gate 56 prior to the Gs gate 57 right before a turn-off timing of the semiconductor device 100 so as to stop the conductivity modulation in the IGBT 51 having a low ON voltage. In addition, the conductivity modulation is prevented from occurring in the dual gate IGBT 52 having a high ON voltage, and the semiconductor device 100 is in a high ON voltage state in which the carrier concentration is temporarily reduced.

Next, when a voltage lower than the threshold voltage is applied to the Gs gate 57, a reverse voltage is applied at a high speed between a collector and an emitter of the semiconductor device 100 and a current is reduced at a high speed so as to turn off the semiconductor device 100. Accordingly, a low turn-off loss performance can be achieved. An operation and performance of the semiconductor device 100 will be described in detail with reference to the drawings.

Figure 2:
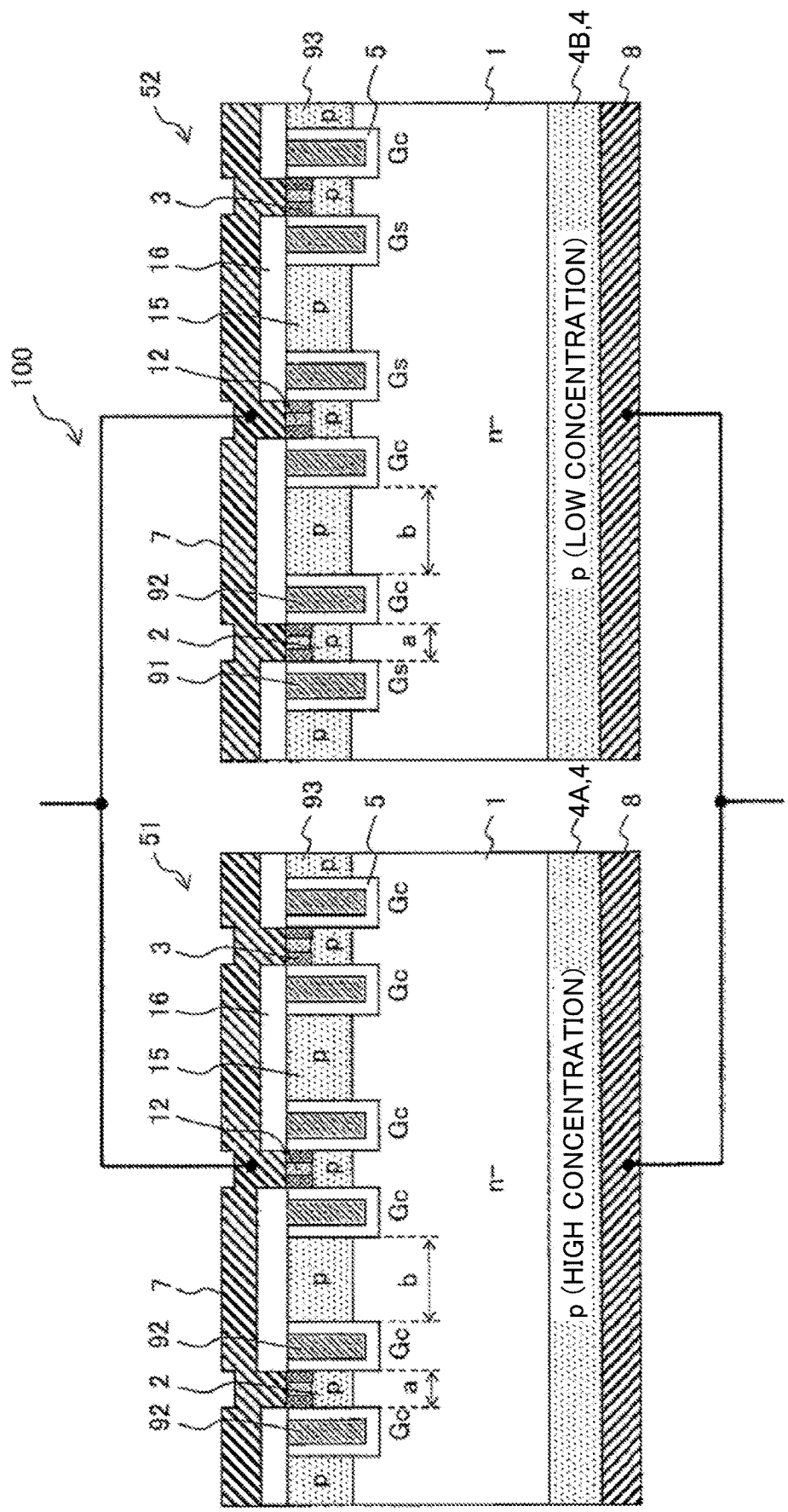
FIG. 2 is a diagram showing an example of a cross-sectional structure of a semiconductor device including two IGBTs that form the semiconductor device according to the first embodiment.

FIG. 2 is a diagram showing an example of a cross-sectional structure of a semiconductor device including two IGBTs 51 and 52 that form the semiconductor device 100 according to the first embodiment. The IGBT 51 includes a plurality of trench-shaped Gc gates 92 as gate electrodes. The same gate control signal Gc 56 is applied to all of the Gc gates 92. In contrast, the IGBT 52 includes a plurality of trench-shaped Gs gates 91 and a plurality of trench-shaped Gc gates 92. The gate control signal Gs 57 is applied to the Gs gates 91 and the gate control signal Gc 56 is applied to the Gc gates 92.

As shown in FIG. 2, the IGBTs 51 and 52 include n⁻ type drift layers 1, p type well layers 2 that are adjacent to the n⁻ type drift layers 1 in a vertical direction, and p type collector layers 4A and 4B that are provided at an opposite side to the p type well layers 2 and are adjacent to the n⁻ type drift layers 1 in the vertical direction. p type power supply layers 12 and n type emitter regions 3 are provided adjacent to upper portions of the p type well layers 2. The p type well layers 2 and then type emitter regions 3 are in contact with the trench-shaped Gs gates 91 or Gc gates 92 via gate insulation films 5.

Of two gate electrodes that are in contact with the same one p type well layer 2 via the gate insulation film 5, both of the gate electrodes are the Gc gates 92 in the IGBT 51, and one of the gate electrodes is the Gc gate 92 and the other one is the Gs gate 91 in the IGBT 52. In the IGBT 51, a plurality of sets each including two Gc gates 92 that are in contact with one p type well layer 2 are repeatedly arranged in a horizontal direction. Similarly, in the IGBT 52, a plurality of sets each including the Gs gate 91 and the Gc gate 92 that are in contact with one p type well layer 2 are repeatedly arranged in the horizontal direction.

The emitter electrodes 7 are provided above the Gs gates 91, the Gc gates 92, and the p type well layers 2 and have a downward protruding trench-shaped shape. The emitter electrodes 7 are in contact with the p type power supply layers 12 and the n type emitter regions 3. On the other hand, the emitter electrodes 7 are insulated from the gate electrodes (the Gs gates 91 or the Gc gates 92) via insulation films 16. The $n^-$ type drift layers 1 are in contact with the p type collector layers 4A and 4B on surfaces opposite to the p type well layers 2. The collector electrodes 8 are provided in contact with lower surface sides of the p type collector layers 4A and 4B.

Impurity concentrations of the p type collector layers 4A and 4B in the IGBT 51 and the IGBT 52 are different from each other. That is, an impurity concentration of the p type collector layer 4A in the IGBT 51 having a low ON voltage is higher than an impurity concentration of the p type collector layer 4B in the dual gate IGBT 52 having a high ON voltage. Therefore, a conductivity modulation increases and a resistance during conduction is reduced in the $n^-$ type drift layer 1 that is in contact with the p type collector layer 4A having a high concentration. As a result, the IGBT 51 exhibits a low ON voltage performance. On the other hand, since a conductivity modulation is not significantly generated and a resistance during conduction is not much reduced in the $n^-$ type drift layer 1 that is in contact with the p type collector layer 4B having a low concentration, the IGBT 52 exhibits a high ON voltage performance.

Semiconductor layers that form base bodies of the IGBT 51 and the IGBT 52 are formed of silicon (Si) or silicon carbide (SiC). The gate insulation films 5 are formed of silicon dioxide ($SiO_2$).

Figure 3:
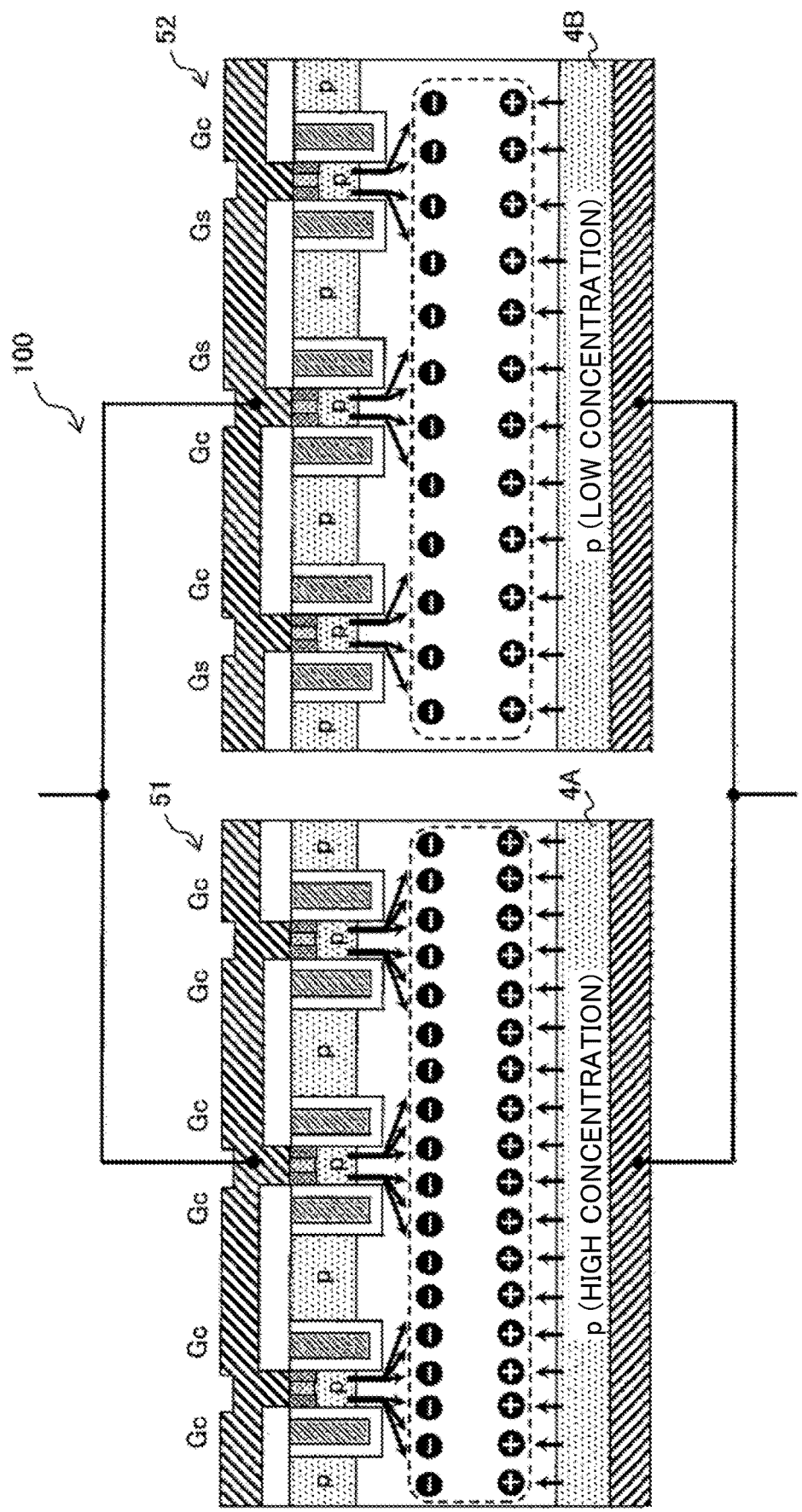
FIG. 3 is a schematic diagram showing a distribution of electron carriers and hole carriers when a voltage equal to or higher than a threshold voltage is applied to Gs gates and Gc gates and a forward voltage is applied between collector electrodes and emitter electrodes in the semiconductor device according to the first embodiment.

Next, an operation of the semiconductor device 100 according to the first embodiment of the invention will be described in detail with reference to FIGS. 3 and 4. FIG. 3 is a schematic diagram showing a distribution of electron carriers and hole carriers when a voltage equal to or higher than a threshold voltage is applied to the Gs gates 91 and the Gc gates 92 and a forward voltage is applied between the collector electrodes 8 and the emitter electrodes 7 in the semiconductor device 100 according to the first embodiment. Since a cross-sectional structure of the IGBTs 51 and 52 in FIG. 3 is the same as the cross-sectional structure shown in FIG. 2, reference numerals for identifying electrodes and semiconductor layers that form the IGBTs 51 and 52 are omitted in FIG. 3 for simplicity (the same applies to FIG. 4, FIG. 10, FIG. 11, and the like).

When a voltage equal to or higher than the threshold voltage is applied to the Gs gates 91 and the Gc gates 92, channel layers (inversion layers) in which electrons are accumulated are formed at interface portions inside the P type well layers 2 that are respectively in contact with the Gs gates 91 and the Gc gates 92 via the gate insulation films 5.

In this case, when a forward voltage is applied between the collector electrodes 8 and the emitter electrodes 7, electrons are injected from the emitter electrodes 7 into the $n^-$ type drift layers 1 through the channel layers. Then, holes are induced by the injected electrons and injected from the p type collector layer 4 into the $n^-$ type drift layers 1 to generate a conductivity modulation inside the $n^-$ type drift layers 1.

In each of the IGBT 51 and the IGBT 52 according to the present embodiment, the p type well layer 2 is provided on one side surface of the trench-shaped Gs gate 91 and one side surface of the Gc gate 92, and a p type region 15 having a floating potential or the $n^-$ type drift layer 1 is provided on the other side surface of the Gs gate 91 and the other side surface of the Gc gate 92. That is, the channel layer is formed only on one side surface of either the trench-shaped Gs gate 91 or the trench-shaped Gc gate 92.

An interval a between gate electrodes whose one side is provided with the p type well layer 2 is smaller than an interval b between gate electrodes whose one side is not provided with the p type well layer 2. Accordingly, a region of the p type well layer 2 that serves as a current path to the emitter electrodes 7 for hole carriers injected from the p type collector layers 4A and 4B in a conducting state is small. As a result, resistances of these portions are increased. Accordingly, an effect of accumulating hole carriers can be improved and a conductivity modulation effect can be facilitated.

In the present embodiment, particularly in the IGBT 51 including the p type collector layer 4A having a high concentration, since a concentration of holes flowing into the $n^-$ type drift layer 1 is high, the conductivity modulation is facilitated and the carrier concentration in the $n^-$ type drift layer 1 is further increased. Therefore, a predetermined current can flow at a small voltage drop, that is, a low ON voltage, and a conduction loss can be reduced in the present embodiment.

Figure 4:
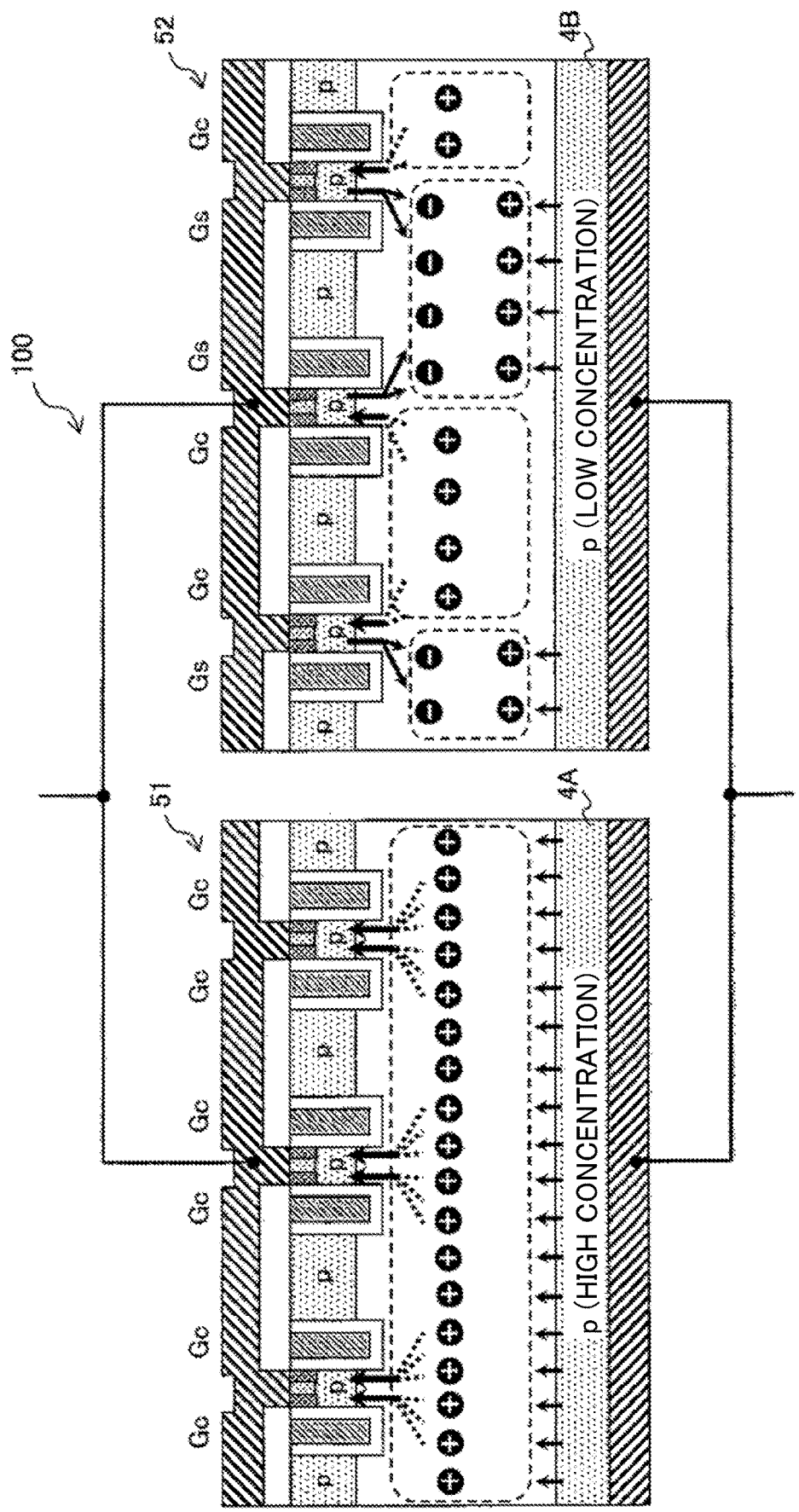
FIG. 4 is a schematic diagram showing a distribution of electron carriers and hole carriers when, following a state in FIG. 3, a voltage lower than the threshold voltage is applied to the Gc gates, a voltage equal to or higher than the threshold voltage is applied to the Gs gates, and a forward voltage is applied between the collector electrodes and the emitter electrodes in the semiconductor device according to the first embodiment.

FIG. 4 is a schematic diagram showing a distribution of electron carriers and hole carriers when, following a state in FIG. 3, a voltage lower than the threshold voltage is applied to the Gc gates 92, a voltage equal to or higher than the threshold voltage is applied to the Gs gates 91, and a forward voltage is applied between the collector electrodes 8 and the emitter electrodes 7 in the semiconductor device 100 according to the first embodiment. In this case, channel layers (inversion layers) in which electrons are accumulated are formed at interface portions inside the p type well layers 2 that are in contact with the Gs gates 91 via the gate insulation films 5. Hole accumulation layers are formed at interface portions inside the p type well layers 2 that are in contact with the Gc gates 92 via the gate insulation films 5.

In such a state, when a forward voltage is applied between the collector electrode 8 and the emitter electrode 7, electron carriers are injected from the emitter electrode 7 into the $n^-$ type drift layer 1 through the channel layers formed at Gs gate 91 sides in the IGBT 52. At a side where hole carriers are extracted from the p type collector layer 4B, a part of hole carriers inside the $n^-$ type drift layer 1 is discharged to the emitter electrode 7 via the hole accumulation layers formed at Gc gate 92 sides. Therefore, a conductivity modulation in the $n^-$ type drift layer 1 can be prevented and an accumulated carrier concentration can be reduced as compared with a case in which a voltage equal to or higher than the threshold voltage is applied to both the Gs gates 91 and the Gc gates 92.

The IGBT 51 includes the p type collector layer 4A having a high concentration and all gate electrodes are Gc gates 92. The IGBT 52 includes the p type collector layer 4B having a low concentration and a part of gate electrodes are Gc gates 92. Therefore, carrier concentrations in the n⁻ type drift layers 1 can be controlled by controlling (bias controlling) a voltage applied to the Gc gates 92 in the semiconductor device 100 according to the present embodiment.

Therefore, when the semiconductor device 100 is conductive, that is, when a voltage equal to or higher than the threshold voltage is applied to the Gs gates 91 and the Gc gates 92 and carriers are accumulated in the n⁻ type drift layers 1 at a high concentration, most of the carriers can be eliminated by applying a voltage lower than the threshold voltage to the Gc gates 92 only. That is, an accumulated carrier concentration in the n⁻ type drift layers 1 can be made lower than the related arts. In other words, compared with IGBTs disclosed in PTL 1, PTL 2, and PTL 3, the semiconductor device 100 according to the present embodiment has a high controllability of an ON voltage by using a bias voltage (an applied voltage) of the Gc gates 92.

When a turn-off operation in which the semiconductor device 100 according to the present embodiment transitions from a conducting state to a non-conducting state, a period in which a collector-emitter voltage and a collector current change at the time of transitioning to the non-conducting state depends on an accumulated carrier concentration that contributes to a conductivity modulation during conduction. Therefore, an accumulated carrier concentration inside the semiconductor device 100 can be controlled by a bias of the Gc gates 92. Particularly in the present embodiment having a high controllability of the carrier concentration, both a low ON voltage performance and a low turn-off loss performance during conduction can be achieved.

Figure 5A:
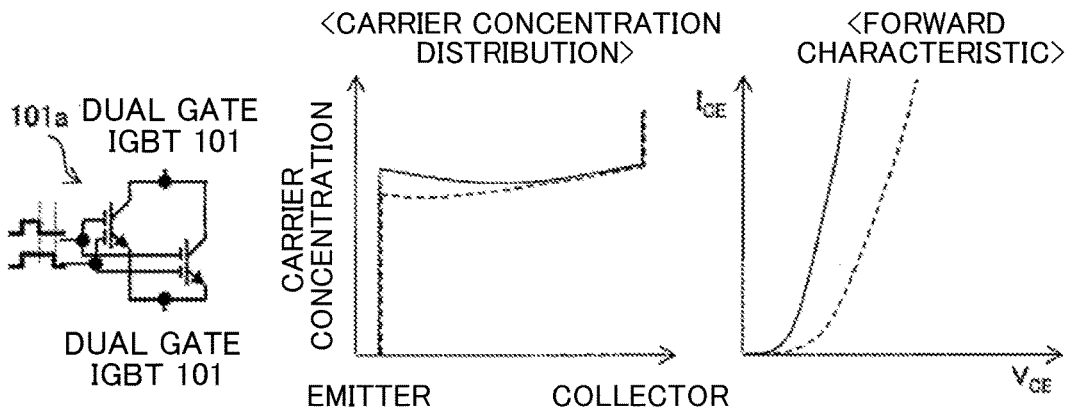
Figure 5B:
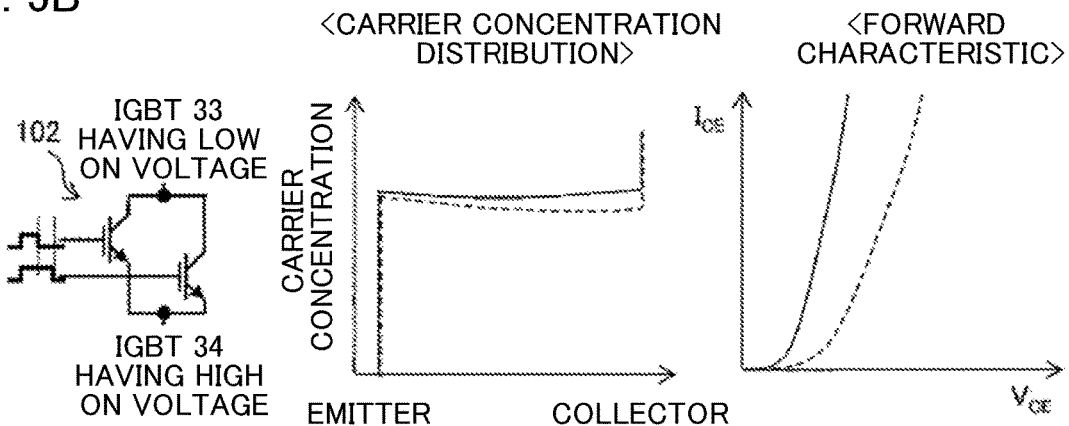
Figure 5C:
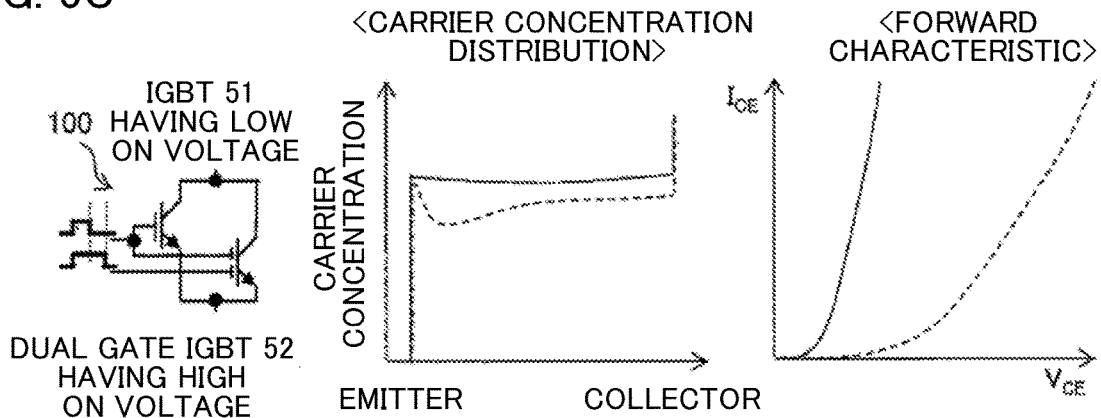
Figure 27:
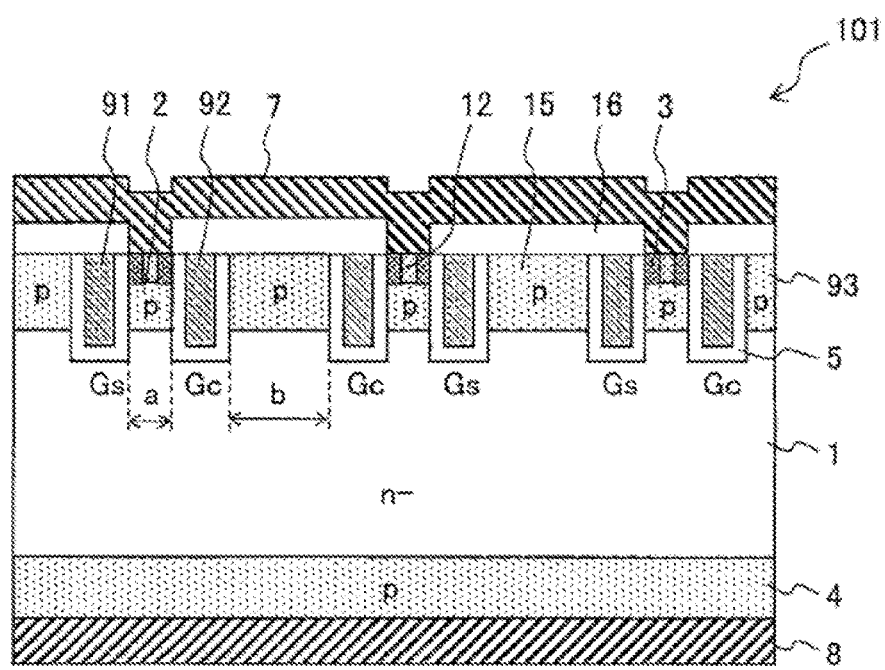
FIG. 27 is a diagram showing an example of a cross-sectional structure of an IGBT disclosed in PTL 1.
Figure 28:
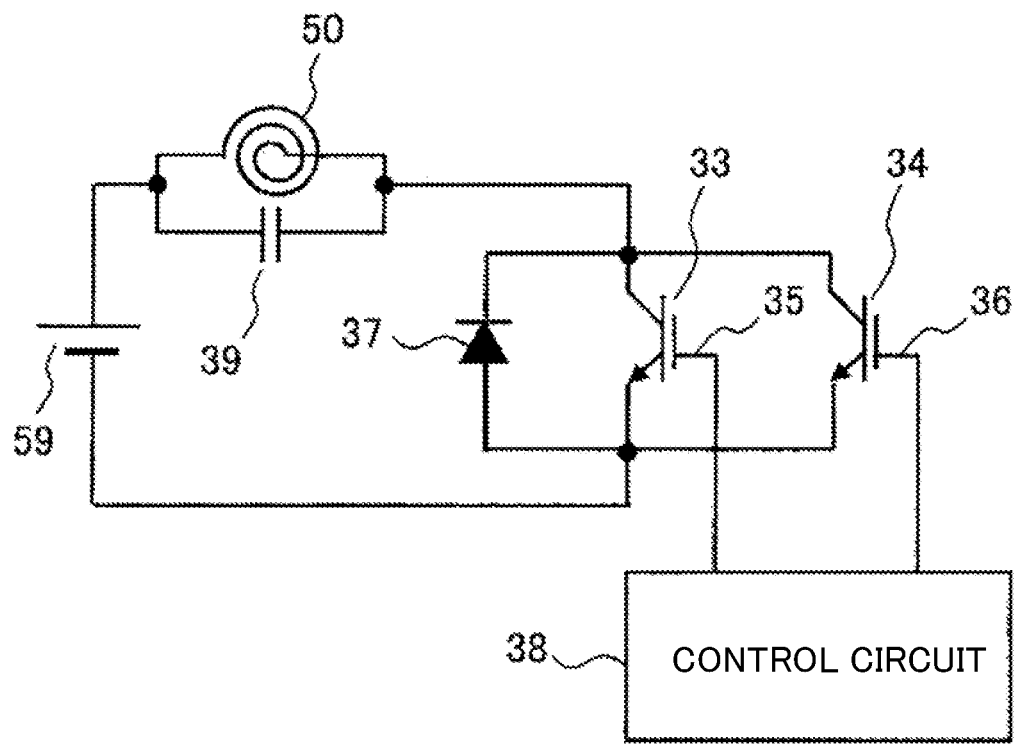
FIG. 28 is a diagram showing an example of a power switching circuit using an IGBT disclosed in PTL 2.

Hereinafter, effects of the present embodiment, particularly effects related to a power loss, will be described with reference to FIGS. 5 to 8. FIG. 5 is a diagram showing, a carrier concentration distribution and a forward characteristic of a collector-emitter current at the time of turn-on and right before turn-off in the semiconductor device 100 according to the present embodiment as compared with the related arts. FIG. 5(a) shows an example of an IGBT 101a based on PTL 1, FIG. 5(b) shows an example of an IGBT 102 based on PTL 2 and PTL 3, and FIG. 5(c) shows an example of the semiconductor device 100 according to the present embodiment. Here, the IGBT 101a based on PTL 1 shown in FIG. 5(a) refers to an IGBT in which two dual gate IGBTs 101 (see FIG. 27) having a same ON voltage are connected in parallel. The IGBT 102 based on PTL 2 and PTL 3 shown in FIG. 5(b) refers to an IGBT in which two IGBTs 33 and 34 (see FIG. 28) having different ON voltages are connected in parallel.

In FIG. 5, a carrier concentration is a value derived from an average value of two IGBTs connected in parallel. FIG. 5 shows a distribution of carriers from the n type emitter region 3 in the n⁻ type drift layer 1 to the vicinity of the p type collector layer 4 in each IGBT. In each graph, a solid line indicates an example in which a voltage equal to or higher than the threshold voltage is applied to both the Gs gates 91 and Gc gates 92, and a broken line indicates an example in which a voltage equal to or higher than the threshold voltage is applied to the Gs gates 91 and a voltage lower than the threshold voltage is applied to Gc gates 92.

In the IGBT 101a based on PTL 1, an accumulated carrier concentration at an n type emitter region 3 side in the n⁻ type drift layer 1 can be controlled by controlling a bias (an applied voltage) of the Gc gates 92. This is because accumulation and discharging of hole carriers at the n type emitter region 3 side can be controlled by bias controlling the Gc gates 92 in the dual gate IGBT 101. On the other hand, it is difficult to control an accumulated carrier concentration in the vicinity of the p type collector layer 4 in the n⁻ type drift layer 1.

In the IGBT 102 based on PTL 2 and PTL 3, an accumulated carrier concentration in the vicinity of the p type collector layer 4 in the n⁻ type drift layer 1 can be controlled by bias controlling the Gc gates. This is because the accumulated carrier concentration in the vicinity of the p type collector layer 4 in the n⁻ type drift layer 1 can be controlled by controlling ON and OFF of an IGBT that has a low ON voltage and a high hole carrier concentration. On the other hand, it is difficult to control an accumulated carrier concentration at the n type emitter region 3 side in the n⁻ type drift layer 1.

In the semiconductor device 100 according to the present embodiment, an accumulated carrier concentration can be controlled both at the n type emitter region 3 side and at a p type collector layer 4 side in the n⁻ type drift layer 1 by bias controlling the Gc gates 92 as compared with the related arts. That is, the semiconductor device 100 according to the present embodiment can control the accumulated carrier concentration throughout a wider region in the n⁻ type drift layer 1 as compared with the IGBT 101 based on PTL 1 and the IGBT 102 based on PTL 2 and PTL 3. This is because the dual gate IGBT 52 has a function of controlling accumulation and discharging of hole carriers at the n type emitter region 3 side in the n⁻ type drift layer 1, and a function of controlling injection and discharging of hole carriers from the p type collector layer 4A having a high concentration in the vicinity of the p type collector layer 4.

The distribution of carrier concentrations in the n⁻ type drift layers 1 as described above greatly affects a controllability of an ON voltage of an IGBT. As referring to the forward characteristic shown in FIG. 5, the semiconductor device 100 according to the present embodiment has a high controllability of an ON voltage by a bias of the Gc gates 92 as compared with the IGBTs 101 and 102 based on PTL 1, PTL 2, and PTL 3. For example, when a bias equal to or higher than the threshold voltage is applied to the Gc gates 92 similarly to the Gs gates 91, a predetermined current can be caused to flow at a low ON voltage that is equal to the ON voltage in PTL 1, PTL 2, and PTL 3. On the other hand, when a bias lower than the threshold voltage is applied to the Gc gates, an ON voltage required to cause the predetermined current is higher than ON voltages of the IGBTs 101 and 102 in the related arts based on PTL 1, PTL 2, and PTL 3.

This refers to a characteristic of a high controllability of an accumulated carrier concentration. Since the semiconductor device 100 according to the present embodiment has a high controllability characteristic of an accumulated carrier concentration, the semiconductor device 100 according to the present embodiment has a low ON voltage, that is, a low conduction loss during conduction the same as the related arts, but has a lower turn-off loss than semiconductor devices disclosed in the related arts. Therefore, a trade-off relationship between a conduction loss and a turn-off loss can be improved.

FIG. 6 is a diagram showing an example of operation waveforms when the semiconductor device 100 according to the first embodiment is turned off. Here, FIG. 6(a) shows an example of a Gs gate drive signal waveform, FIG. 6(b) shows an example of a Gc gate drive signal waveform, FIG. 6(c) shows an example of a collector-emitter voltage (Vce) waveform, FIG. 6(d) shows an example of a collector-emitter current (Ice) waveform, and FIG. 6(e) shows an example of a current and voltage product (Ice·Vce) waveform.

In FIG. 6(a) and FIG. 6(b), a broken line in the horizontal direction indicates a threshold voltage 26, and thick solid line waveforms 18 and 19 indicate voltage levels of drive signals that are respectively supplied to the Gs gates 91 and the Gc gates 92. Thick solid line waveforms 29 in FIG. 6(c), FIG. 6(d), and FIG. 6(e) indicate waveforms obtained when the thick solid line waveforms 18 and 19 in FIG. 6(a) and FIG. 6(b) are supplied to the Gs gates 91 and the Gc gates 92 of the semiconductor device 100 according to the present embodiment. Thick broken line waveforms 28 in FIG. 6(c), FIG. 6(d), and FIG. 6(e) indicate waveforms obtained in a case (corresponding to the related arts) in which driving signals (indicated by waveforms 18 and 18a) at the same timing are supplied to the Gs gates 91 and the Gc gates 92 of the semiconductor device 100 according to the present embodiment.

As shown in FIG. 6, during a conducting period 23 of the semiconductor device 100 in which a signal equal to or higher than the threshold voltage 26 is input into both the Gs gates 91 and Gc gates 92, a collector-emitter voltage (Vce) is low, and a low conduction loss performance can be achieved. Next, during a period 24 right before turn-off, a drive signal (indicated by the waveform 19) of the Gc gates 92 is reduced to a level lower than the threshold voltage 26 prior to a drive signal (indicated by the waveform 18) of the Gs gates 91. In this manner, since a carrier concentration inside the semiconductor device 100 is reduced and a conductivity modulation effect is prevented, the collector-emitter voltage (Vce) gradually increases. The period 24 right before turn-off is preferably 3 µs or longer.

Next, when the drive signal (indicated by the waveform 18) of the Gs gates 91 is reduced to a level lower than the threshold voltage 26 during a turn-off period 25, injection of carriers is completely stopped in the semiconductor device 100, and a depletion is performed inside the semiconductor device 100 due to a power supply voltage applied between the collector and the emitter. Therefore, the collector-emitter voltage (Vce) is increased, the carriers are discharged, and the collector-emitter current (Ice) is reduced. It can be seen that a change in the solid line waveform 29 indicating the semiconductor device 100 according to the present embodiment takes a shorter time than a change in the broken line waveform 28 indicating the related arts, that is, turn-off is performed at a high speed. Since an accumulated carrier concentration is reduced by a voltage control of the Gc gates 92 during the period 24 right before turn-off, the depletion of the semiconductor device 100 and discharging of carriers are performed at a high speed.

A power loss of the semiconductor device 100 is indicated by a time integral of a current and voltage product (Ice·Vce). Therefore, as shown in FIG. 6(e), an area surrounded by a mount shape of the thick broken line waveform 28 indicating a current and voltage product in the related arts can be reduced to an area surrounded by a mount shape of the thick solid line waveform 29 in the present embodiment in which turn-off is performed at a high speed. That is, both a low conduction loss and a low turn-off loss can be achieved according to the present embodiment.

Figure 7A:
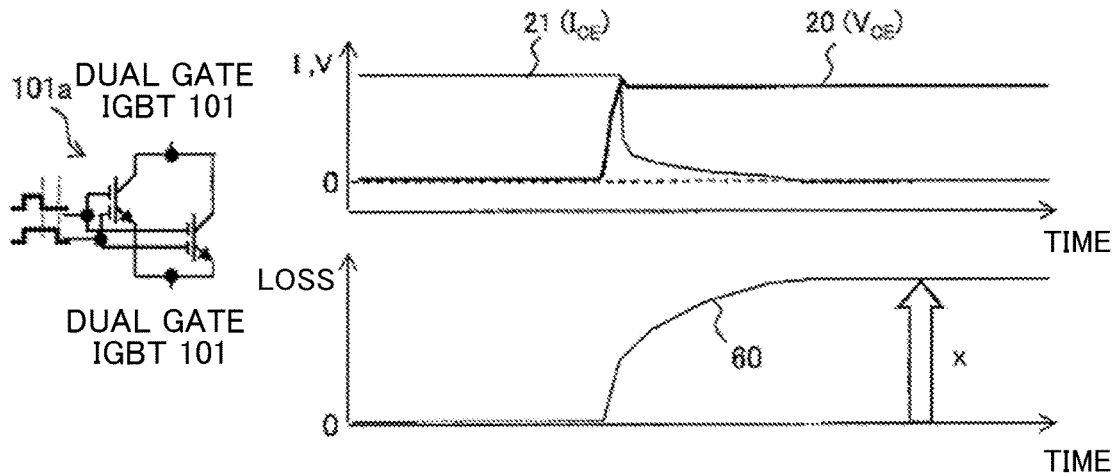
Figure 7B:
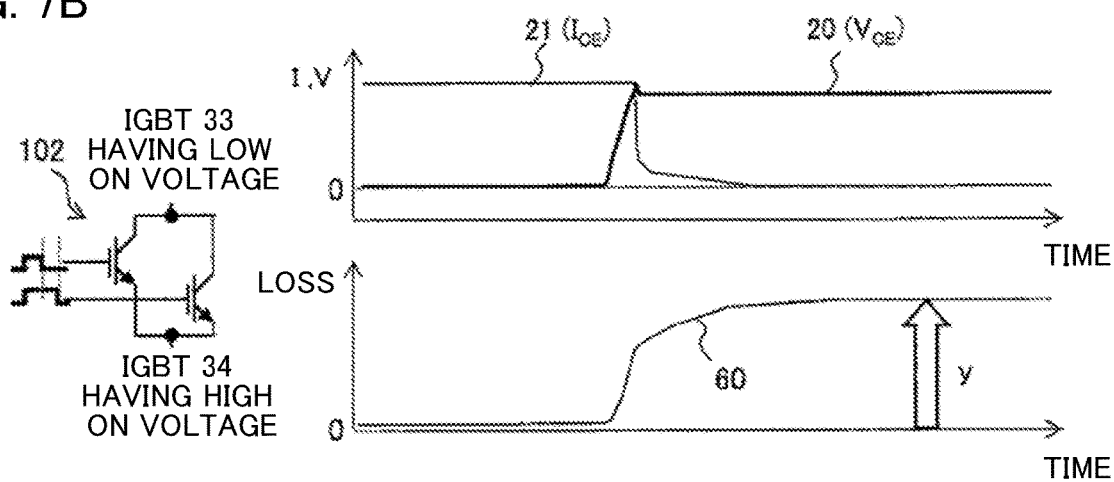
Figure 7C:
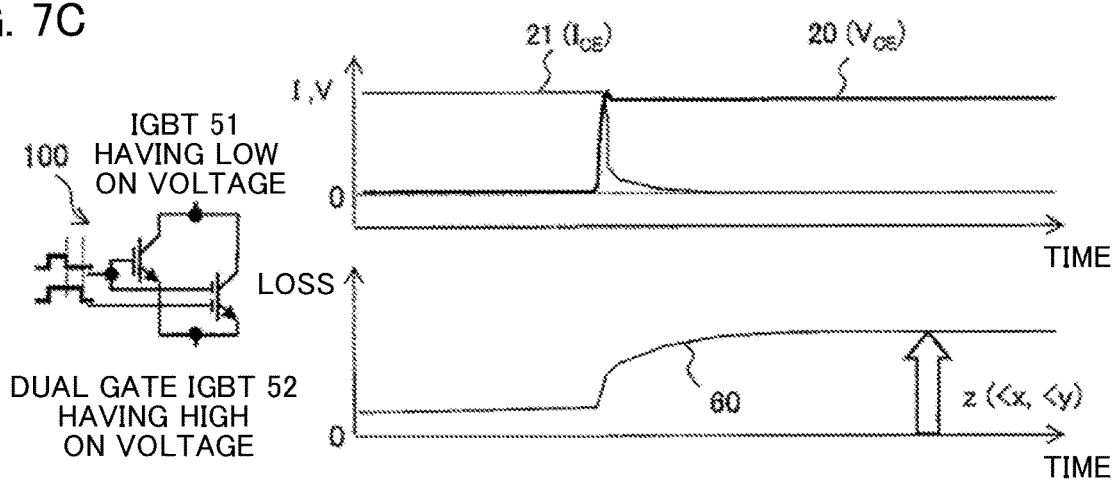

FIG. 7 is a diagram showing an example of a collector-emitter voltage and current waveform and a powder loss waveform when the semiconductor device 100 according to the first embodiment is turned off as compared with the related arts. Here, FIG. 7(a) shows an example of the IGBT 101a based on PTL 1, FIG. 7(b) shows an example of the IGBT 102 based on PTL 2 and PTL 3, and FIG. 7(c) shows an example of the semiconductor device 100 according to the present embodiment. In each upper portion graph of the FIG. 7(a), FIG. 7(b), and FIG. 7(c), a thick solid line waveform 20 indicates a collector-emitter voltage (Vce) and a thin solid line waveform 21 indicates a collector-emitter current (Ice). In each lower portion graph, a thin solid line waveform 60 indicates a power loss amount which is a time integral of a current and voltage product (Ice·Vce).

In the IGBT 101a based on PTL 1, time required to increase a collector-emitter voltage (Vce) 20 is short while time required to reduce a collector-emitter current (Ice) 21 is long as shown in FIG. 7(a). That is, the collector-emitter voltage (Vce) 20 is increased at a high speed while the collector-emitter current (Ice) 21 is reduced at a low speed.

This is because a distribution of accumulated carrier concentrations right before turn-off is reduced in the vicinity of the n type emitter region 3 side in the n⁻ type drift layer 1 while remaining in a high state in the vicinity of the p type collector layer 4 in the IGBT 101 based on PTL 1. Therefore, although a voltage is increased rapidly by performing a depletion at a high speed in the vicinity of the n type emitter region 3 side, a current generated by discharging hole carriers that have a high concentration and are accumulated in the vicinity of the p type collector layer 4 is increased. That is, it can be said that a loss reducing effect is reduced due to a power loss occurring in a period in which a current is reduced in the IGBT 101a based on PTL 1.

Next, in the IGBT 102 based on PTL 2 and PTL 3, time required to increase the collector-emitter voltage (Vce) 20 is long while time required to reduce the collector-emitter current (Ice) 21 is short as shown in FIG. 7(b). That is, the collector-emitter voltage (Vce) 20 is increased at a low speed while the collector-emitter current (Ice) 21 is reduced at a high speed.

Therefore, a current generated by discharging hole carriers accumulated in the vicinity of the p type collector layer 4 is reduced while a speed of performing a depletion is reduced due to accumulated carriers that have a high concentration and accumulate in the vicinity of the n type emitter region 3 side. Therefore, it takes time to increase the collector-emitter voltage (Vce) 20. That is, it can be said that a power loss reducing effect is reduced due to a power loss generated in a period in which a voltage is increased in the IGBT 102 based on PTL 2 and PTL 3.

Next, in the semiconductor device 100 according to the present embodiment, time required to increase the collector-emitter voltage (Vce) 20 is short and time required to reduce the collector-emitter current (Ice) 21 is also short as shown in FIG. 7(c). That is, the collector-emitter voltage (Vce) 20 is increased at a high speed and the collector-emitter current (Ice) 21 is reduced at a high speed according to the present embodiment.

This is because an accumulated carrier concentration right before turn-off is reduced in both the vicinity of the n type emitter region 3 side in the n⁻ type drift layer 1 and the vicinity of the p type collector layer 4 side in the n⁻ type drift layer 1, and the entire region throughout the n⁻ type drift layer 1 is in a low concentration state in the semiconductor device 100 according to the present embodiment. Therefore, the voltage is increased rapidly by performing a depletion at a high speed in the vicinity of the n type emitter region 3 side and a current generated by discharging hole carriers accumulated in the vicinity of the p type collector layer 4 is reduced in the n⁻ type drift layer 1. Therefore, an effect of greatly reducing a turn-off loss can be obtained in the semiconductor device 100 according to the present embodiment as compared with the related arts. A turn-off loss z of the semiconductor device 100 according to the present embodiment is smaller than a turn-off loss x of the IGBT 101a based on PTL 1 and a turn-off loss y of the IGBT 102 based on PTL 2 and PTL 3.

Figure 8:
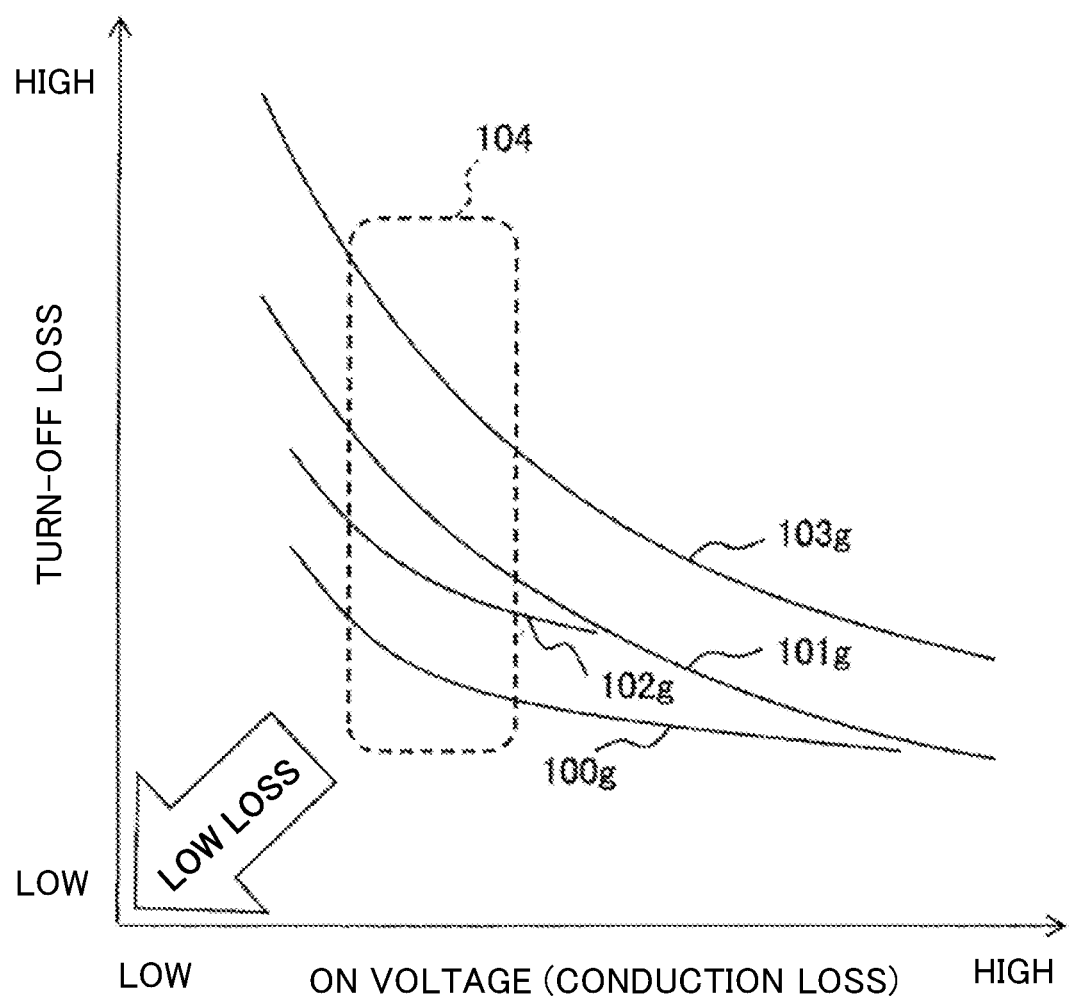
FIG. 8 is a diagram showing an example of a trade-off curve between a turn-off loss and an ON voltage (a conduction loss) in the semiconductor device according to the first embodiment as compared with the related arts.

FIG. 8 is a diagram showing an example of a trade-off curve between a turn-off loss and an ON voltage (a conduction loss) in the semiconductor device 100 according to the first embodiment as compared with the related arts. Here, a curve 100g in FIG. 8 is a trade-off curve obtained by the semiconductor device 100 according to the present embodiment, a curve 101g is a trade-off curve obtained by the IGBT 101a based on PTL 1, a curve 102g is a trade-off curve obtained by the IGBT 102 based on PTL 2 and PTL 3, and a curve 103g is a trade-off curve obtained by a general IGBT having only one type of gate electrode in the related art.

These trade-off curves are obtained based on performances of a plurality of IGBTs in which an impurity concentration of the p type collector layer 4 is changed in each IGBT. However, a parameter of changing an impurity concentration of the p type collector layer 4 in an IGBT element having a low ON voltage among two IGBTs is used in the semiconductor device 100 according to the present embodiment and the IGBT 102 based on PTL 2 and PTL 3.

As shown in FIG. 8, trade-off relationships of the dual gate semiconductor device 100, the IGBT 101a, and the IGBT 102 are all improved as compared with a trade-off relationship (the curve 103g) of the IGBT having only one type of gate electrode in the related art. Considering an ON voltage is around a region 104 indicated by a broken line, improvement effects increase in order of the IGBT 101a, the IGBT 102, and the semiconductor device 100.

As described above, an effect of greatly reducing a turn-off loss can be obtained while maintaining a low ON voltage performance in the semiconductor device 100 according to the present embodiment. That is, according to the present embodiment, an IGBT having a low conduction loss and a low turn-off loss can be implemented.

Second Embodiment

Figure 9:
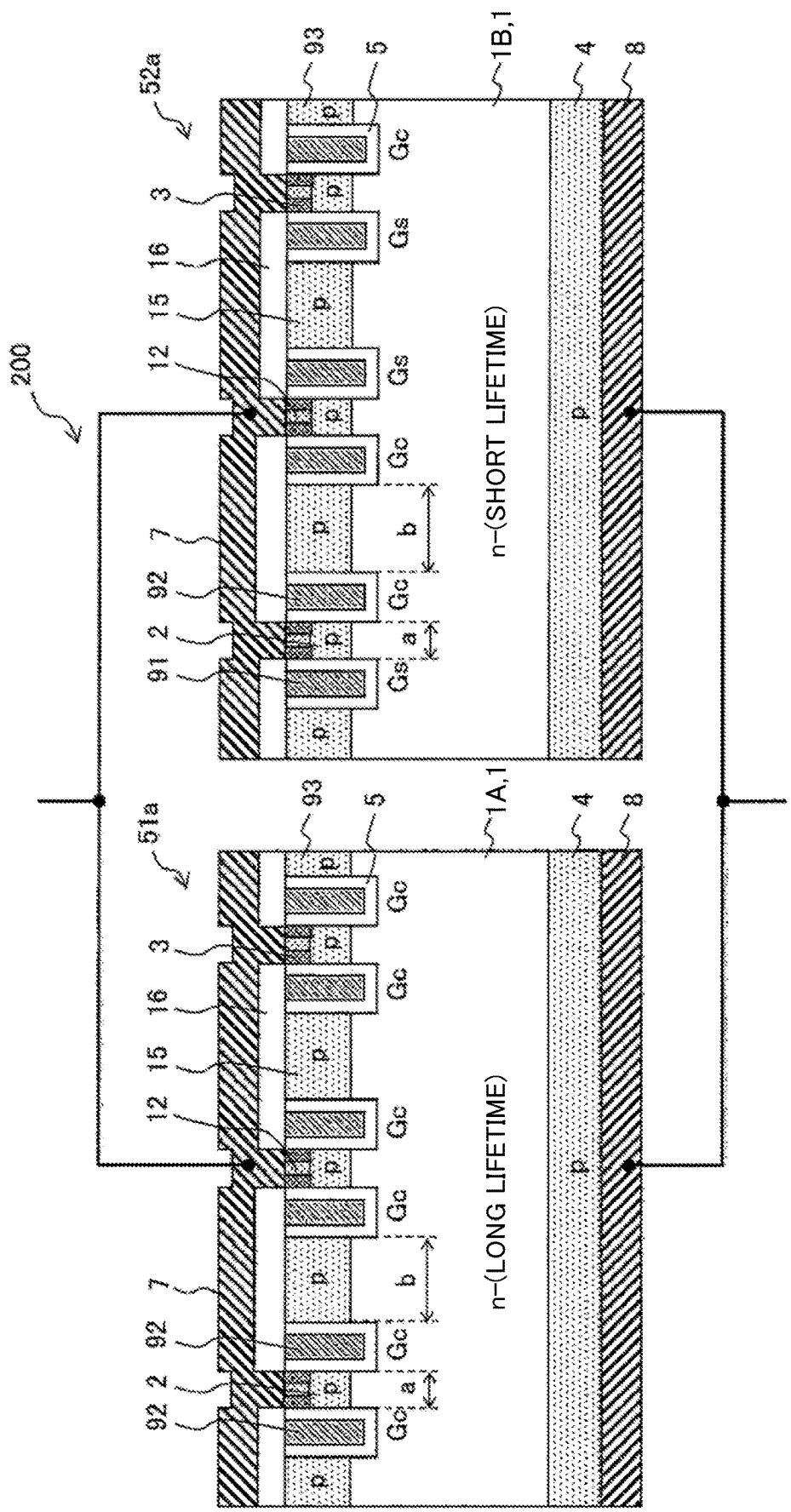
FIG. 9 is a diagram showing an example of a cross-sectional structure of a semiconductor device including two IGBTs that form a semiconductor device according to a second embodiment.

FIG. 9 is a diagram showing an example of a cross-sectional structure of a semiconductor device including IGBTs 51a and 52a that form a semiconductor device 200 according to the second embodiment of the invention. A circuit configuration of the semiconductor device 200 according to the second embodiment is the same as a circuit configuration of the semiconductor device 100 according to the first embodiment as shown in FIG. 1. A cross-sectional structure of the IGBT 51a and the IGBT 52a that form the semiconductor device 200 according to the second embodiment is substantially the same as a cross-sectional structure of the IGBT 51 and the IGBT 52 according to the first embodiment as shown in FIG. 2. Hereinafter, differences of the second embodiment from the first embodiment will be mainly described.

As shown in FIG. 9, the IGBT 51a includes a plurality of trench-shaped Gc gates 92 as gate electrodes. The same gate control signal Gc 56 is applied to all of the Gc gates 92. In contrast, the IGBT 52b includes a plurality of trench-shaped Gs gates 91 and a plurality of trench-shaped Gc gates 92. The gate control signal Gs 57 is applied to the Gs gates 91, and the gate control signal Gc 56 is applied to the Gc gates 92.

The IGBTs 51a and 52a respectively include the n⁻ type drift layers 1A and 1B, the p type well layers 2 that are adjacent to the n⁻ type drift layers 1A and 1B in a vertical direction, and the p type collector layers 4 that are provided at an opposite side to the p type well layers 2 and are adjacent to the n⁻ type drift layers 1A and 1B in the vertical direction. The p type power supply layers 12 and the n type emitter regions 3 are provided adjacent to upper portions of the p type well layers 2. The p type well layers 2 and the n type emitter regions 3 are in contact with the trench-shaped Gs gates 91 or the trench-shaped Gc gates 92 via gate insulation films 5.

Of two gate electrodes that are in contact with the same one p type well layer 2 via the gate insulation film 5, both of the gate electrodes are the Gc gates 92 in the IGBT 51a, and one of the gate electrodes is the Gc gate 92 and the other one is the Gs gate 91 in the IGBT 52a. In the IGBT 51a, a plurality of sets of two Gc gates 92 that are in contact with one p type well layer 2 are repeatedly arranged in a horizontal direction. Similarly, in the IGBT 52a, a plurality of sets of the Gs gate 91 and the Gc gate 92 that are in contact with one p type well layer 2 are repeatedly arranged in the horizontal direction.

The emitter electrodes 7 are provided above the Gs gates 91, the Gc gates 92, and the p type well layers 2 and have a downward protruding trench-shaped shape. The emitter electrodes 7 are in contact with the p type power supply layers 12 and the n type emitter regions 3. On the other hand, the emitter electrodes 7 are insulated from the gate electrodes (the Gs gates 91 or the Gc gates 92) via the insulation films 16. The n⁻ type drift layers 1A and 1B are in contact with the p type collector layers 4 on surfaces opposite to the p type well layers 2. The collector electrodes 8 are provided in contact with lower surface sides of the p type collector layers 4.

Carrier lifetimes in the n⁻ type drift layers 1A and 1B are different from each other in the IGBT 51a having a low ON voltage and the dual gate IGBT 52a having a high ON voltage. That is, a carrier lifetime in the n⁻ type drift layer 1A is long and a carrier lifetime in the n⁻ type drift layer 1B is short. A carrier lifetime can be controlled by respectively irradiating the n⁻ type drift layers 1A and 1B with different amounts of lifetime killers such as electron beams, protons (P, H⁺), and helium (He).

In the n⁻ type drift layer 1A having a long lifetime, a conductivity modulation is facilitated by hole carriers injected from the p type collector layer 4 and electron carriers injected from the n type emitter region 3 through a channel layer. Therefore, a carrier concentration in the n⁻ type drift layer 1A is increased. Accordingly, an ON voltage of the IGBT 51a is reduced. On the other hand, in the n⁻ type drift layer 1B having a short lifetime, a carrier concentration in the n⁻ type drift layer 1B is reduced since the carrier lifetime is shortened. Therefore, an ON voltage of the IGBT 52a is high.

Although only a carrier lifetime control is performed in the n⁻ type drift layers 1A and 1B in order to implement the IGBT 51a having a low ON voltage and the IGBT 52a having a high ON voltage in the present embodiment, a control of changing impurity concentrations in the p type collector layers 4 may be performed as in the first embodiment.

Figure 10:
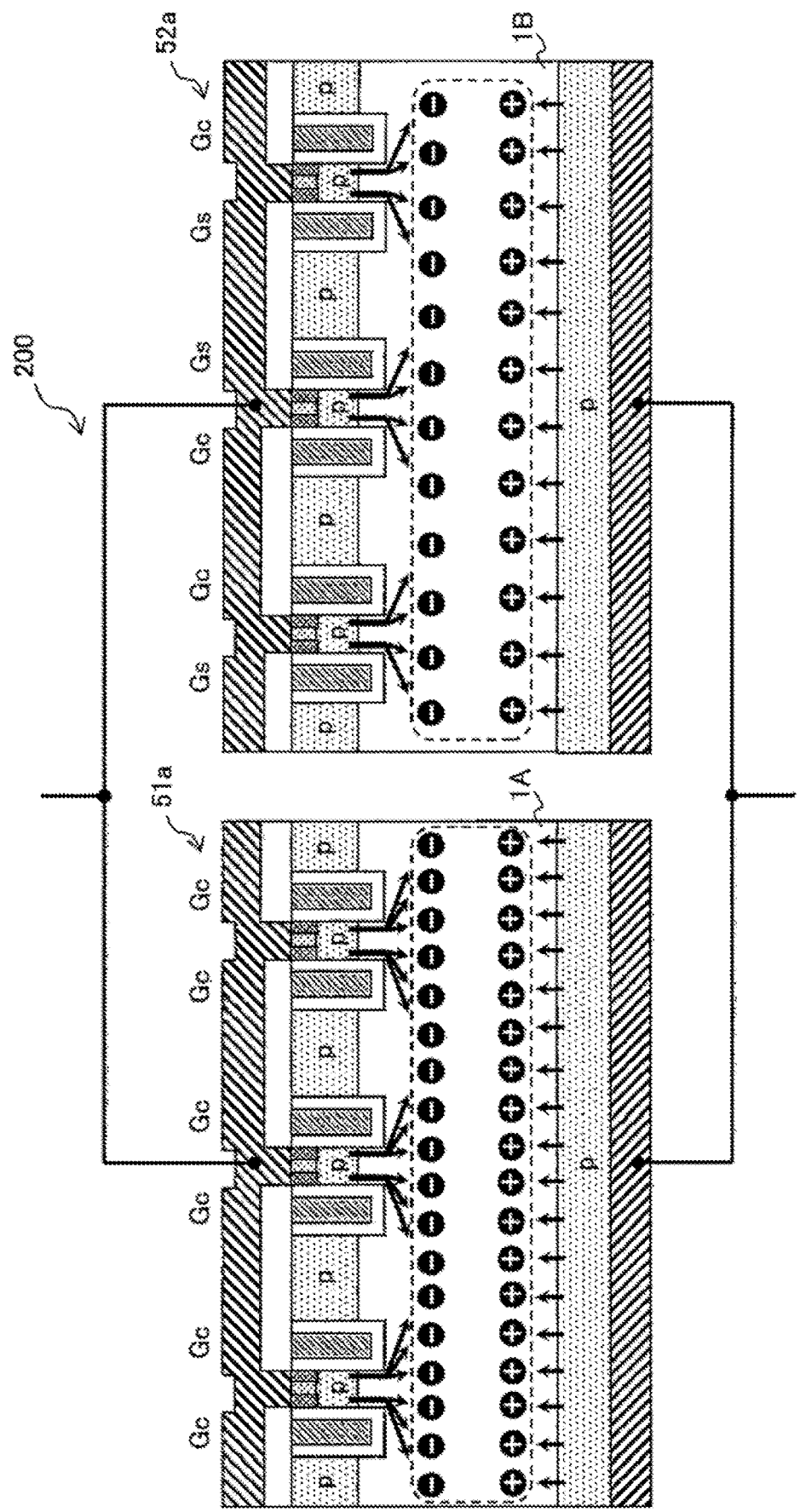
FIG. 10 is a schematic diagram showing a distribution of electron carriers and hole carriers when a voltage equal to or higher than a threshold voltage is applied to Gs gates and Gc gates and a forward voltage is applied between collector electrodes and emitter electrodes in the semiconductor device according to the second embodiment.

FIG. 10 is a schematic diagram showing a distribution of electron carriers and hole carriers when a voltage equal to or higher than a threshold voltage is applied to the Gs gates 91 and the Gc gates 92 and a forward voltage is applied between the collector electrodes 8 and the emitter electrodes 7 in the semiconductor device 200 according to the second embodiment.

In FIG. 10, when a voltage equal to or higher than the threshold voltage is applied to the Gs gates 91 and the Gc gates 92, channel layers (inversion layers) in which electrons are accumulated are formed at interface portions inside the p type well layers 2 that are respectively in contact with the Gs gates 91 and the Gc gates 92 via the gate insulation films 5. In this case, when a forward voltage is applied between the collector electrodes 8 and the emitter electrodes 7, electrons are injected from the emitter electrodes 7 into the n⁻ type drift layers 1A and 1B through the channel layers. Then, holes are induced by the injected electrons and injected from the p type collector layers 4 into the n⁻ type drift layers 1A an 1B to generate conductivity modulations 94 and 95 inside the n⁻ type drift layers 1A and 1B.

In each of the IGBT 51a and the IGBT 52a according to the present embodiment, the p type well layer 2 is provided on one side surface of the trench-shaped Gs gate 91 and one side surface of the trench-shaped Gc gate 92, and the p type region 15 having a floating potential or each of the n⁻ type drift layers 1A and 1B is provided on the other side surface of the Gs gate 91 and the other side surface of the Gc gate 92. That is, the channel layer is formed only on one side surface of either the trench-shaped Gs gates 91 or the trench-shaped Gc gates 92.

The interval a between gate electrodes whose one side is provided with the p type well layer 2 is smaller than the interval b between gate electrodes whose one side is not provided with the p type well layer 2. Accordingly, a region of the p type well layer 2 that serves as a current path to the emitter electrodes 7 for hole carriers injected from the p type collector layers 4 in a conducting state is small. As a result, resistances of these portions are increased. Accordingly, an effect of accumulating hole carriers can be improved and a conductivity modulation effect can be facilitated.

In the present embodiment, particularly in the IGBT 51a in which a carrier lifetime in the n⁻ type drift layer is long, a concentration of hole carriers injected into the n⁻ type drift layer 1A is increased and a conductivity modulation is facilitated. Therefore, a predetermined current can flow at a small voltage drop, that is, a low ON voltage, and a conduction loss can be reduced in the semiconductor device 200 according to the present embodiment.

Figure 11:
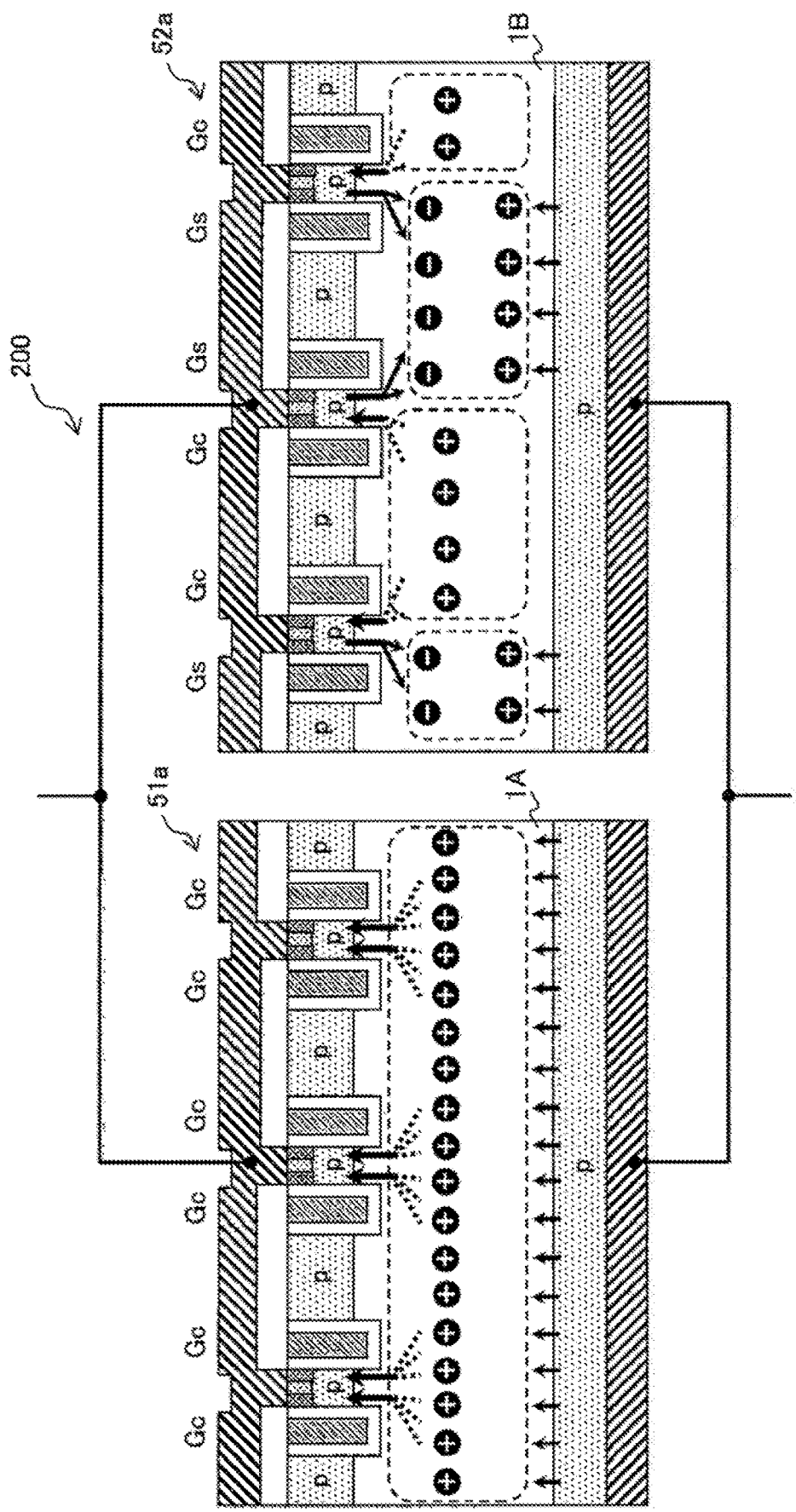
FIG. 11 is a schematic diagram showing a distribution of electron carriers and hole carriers when, following a state in FIG. 10, a voltage lower than the threshold voltage is applied to the Gc gates, a voltage equal to or higher than the threshold voltage is applied to the Gs gates, and a forward voltage is applied between the collector electrodes and the emitter electrodes in the semiconductor device according to the second embodiment.

FIG. 11 is a schematic diagram showing a distribution of electron carriers and hole carriers when, following a state in FIG. 10, a voltage lower than the threshold voltage is applied to the Gc gates 92, a voltage equal to or higher than the threshold voltage is applied to the Gs gates 91, and a forward voltage is applied between the collector electrodes 8 and the emitter electrodes 7 in the semiconductor device 200 according to the second embodiment. In this case, channel layers (inversion layers) in which electrons are accumulated are formed at interface portions inside the p type well layers 2 that are in contact with the Gs gates 91 via the gate insulation films 5. Hole accumulation layers are formed at interface portions inside the p type well layers 2 that are in contact with the Gc gates 92 via the gate insulation films 5.

In such a state, when a forward voltage is applied between the collector electrode 8 and the emitter electrode 7, electron carriers are injected from the emitter electrode 7 into the n⁻ type drift layer 1 through the channel layers formed at the Gs gate 91 sides in the IGBT 52a. At a side where hole carriers are extracted from the p type collector layer 4, a part of the hole carriers inside the n⁻ type drift layer 1B is discharged to the emitter electrode 7 via the hole accumulation layers formed at the Gc gate 92 sides. Therefore, a conductivity modulation in the n⁻ type drift layer 1B can be prevented and an accumulated carrier concentration can be reduced as compared with a case in which a voltage having an abnormal threshold voltage is applied to both the Gs gates 91 and the Gc gates 92.

In the semiconductor device 200 according to the present embodiment, all gate electrodes are the Gc gates 92 in the IGBT 51a including the n⁻ type drift layer 1A in which a carrier lifetime is long. Apart of gate electrodes is Gc gates 92 in the dual gate IGBT 52a including the n⁻ type drift layer 1B in which a carrier lifetime is short. Therefore, a carrier concentration in the n⁻ type drift layer 1 can be controlled by a bias applied to the Gc gates 92 in the semiconductor device 200 according to the present embodiment.

That is, when a voltage equal to or higher than the threshold voltage is applied to the Gs gates 91 and the Gc gates 92 during conduction the semiconductor device 200, carriers are accumulated in the n⁻ type drift layer 1 at a high concentration. Then, most of the carriers can be eliminated by applying a voltage lower than the threshold voltage to the Gc gates 92 only. Therefore, an accumulated carrier concentration in the n⁻ type drift layer 1 can be made lower than the related arts. That is, the semiconductor device 200 according to the present embodiment has a high controllability of an ON voltage by using a bias voltage (an applied voltage) of the Gc gates 92 as compared with IGBTs disclosed in PTL 1, PTL 2, and PTL 3.

When a turn-off operation in which the semiconductor device 200 according to the present embodiment transitions from a conducting state to a non-conducting state, a period in which a collector-emitter voltage and a collector current change at the time of transitioning to the non-conducting state depends on an accumulated carrier concentration that contributes to a conductivity modulation during conduction. Therefore, an accumulated carrier concentration inside the semiconductor device 200 can be controlled by a bias of the Gc gates 92. Particularly in the present embodiment having a high controllability of a carrier concentration, both a low ON voltage performance and a low turn-off loss performance during conduction can be achieved.

As described above, an operation characteristic of the semiconductor device 200 according to the present embodiment is substantially the same as an operation characteristic of the semiconductor device 100 according to the first embodiment. Accordingly, an effect obtained by the present embodiment is substantially the same as an effect obtained by the first embodiment, and therefore a description thereof will be omitted.

Impurity concentrations of the p type collector layers 4 are the same for both the IGBT 51a and the IGBT 52a in the present embodiment. Alternatively, the IGBT 51a may have a higher concentration than the IGBT 52a.

Third Embodiment

Figure 12:
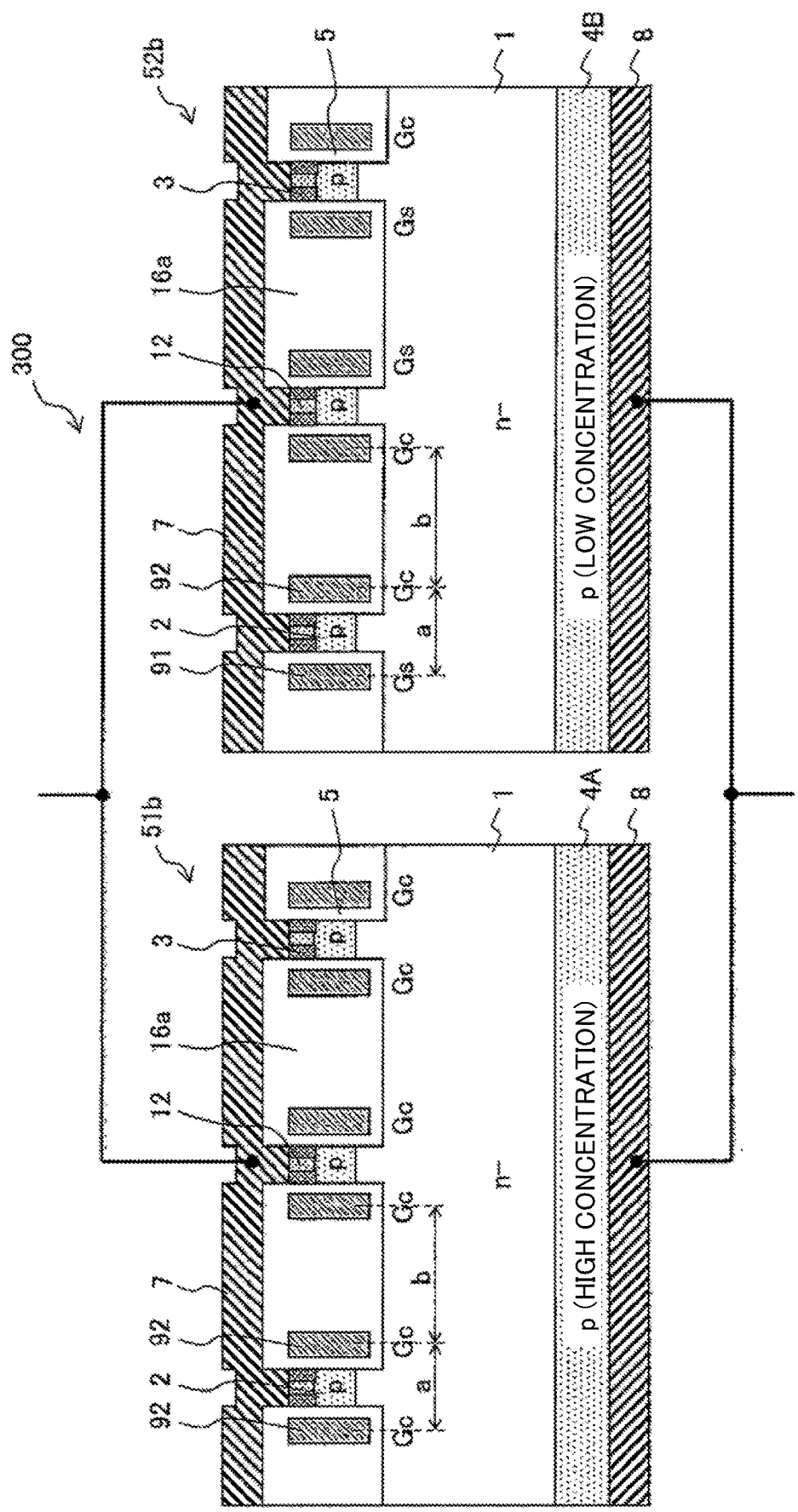
FIG. 12 is a diagram showing an example of a cross-sectional structure of a semiconductor device including two IGBTs that form a semiconductor device according to a third embodiment.

FIG. 12 is a diagram showing an example of a cross-sectional structure of a semiconductor device including two IGBTs 51b and 52b that form a semiconductor device 300 according to the third embodiment of the invention. A circuit configuration of the semiconductor device 300 according to the third embodiment is the same as a circuit configuration of the semiconductor device 100 according to the first embodiment as shown in FIG. 1. A cross-sectional structure of the IGBT 51b and the IGBT 52b that form the semiconductor device 300 according to the third embodiment is substantially the same as a cross-sectional structure of the IGBT 51 and the IGBT 52 according to the first embodiment as shown in FIG. 2. Hereinafter, differences of the third embodiment from the first embodiment will be mainly described.

In the first embodiment (see FIG. 2), the gate electrodes (the Gs gates 91 and the Gc gates 92) are embedded in trenches formed in a base body portion of a semiconductor. In contrast, wide trenches 16a are formed in a base body portion of a semiconductor in the present embodiment. The gate electrodes (the Gs gates 91 and the Gc gates 92) are provided at two side surfaces of the trenches 16a. Insulation members are embedded in portions of the trenches 16a other than the gate electrodes. Hereinafter, a gate electrode having such a structure is referred to as a side wall type.

The IGBT 51b includes a plurality of Gc gates 92 of the side wall type. The same gate control signal Gc 56 (see FIG. 1) is applied to all of the Gc gates 92. The IGBT 52b includes a plurality of Gs gates 91 and Gc gates 92 both are of the side wall type. The Gs control signal Gs 57 is applied to the Gs gates 91, and the gate control signal Gc 56 is applied to the Gc gates 92 (see FIG. 1).

As shown in FIG. 12, the IGBTs 51b and 52b include the n⁻ type drift layers 1, the p type well layers 2 that are adjacent to the n⁻ type drift layers 1 in a vertical direction, and the p type collector layers 4A and 4B that are provided at an opposite side to the p type well layers 2 and are adjacent to the n⁻ type drift layers 1 in the vertical direction. The p type power supply layers 12 and the n type emitter regions 3 are provided adjacent to upper portions of the p type well layers 2. The p type well layers 2 and the n type emitter regions 3 are in contact with side walls of either the Gs gates 91 or the Gc gates 92 via the gate insulation films 5.

Of two gate electrodes that are in contact with the same one p type well layer 2 via the gate insulation film 5, both of the gate electrodes are the Gc gates 92 in the IGBT 51b, and one of the gate electrodes is the Gc gate 92 and the other one is the Gs gate 91 in the IGBT 52b.

The emitter electrodes 7 are provided above the Gs gates 91, the Gc gates 92, and the p type well layers 2 and have a downward protruding trench-shaped shape. The emitter electrodes 7 are in contact with the p type power supply layers 12 and the n type emitter regions 3. On the other hand, the emitter electrodes 7 are insulated from the gate electrodes (the Gs gates 91 or the Gc gates 92) and the n⁻ type drift layers 1 via insulation members embedded in the trenches 16a. The n⁻ type drift layers 1 are in contact with the p type collector layers 4A and 4B on surfaces opposite to the p type well layers 2. The collector electrodes 8 are provided in contact with lower surface sides of the p type collector layers 4A and 4B.

Impurity concentrations of the p type collector layers 4A and 4B are different in the IGBT 51b having a low ON voltage and the dual gate IGBT 52b having a high ON voltage. An impurity concentration of the p type collector layer 4A in the IGBT 51b having a low ON voltage is higher than an impurity concentration of the p type collector layer 4B in the dual gate IGBT 52b having a high ON voltage.

As described above, the impurity concentrations in the p type collector layers 4A and 4B are different, so that concentrations of hole carriers injected from the p type collector layers 4A and 4B into the n⁻ type drift layers 1 are also different. Therefore, a conductivity modulation increases and a resistance during conduction is reduced in the n⁻ type drift layer 1 that is in contact with the p type collector layer 4A having a high concentration. As a result, the IGBT 51b obtains a low ON voltage performance. On the other hand, a conductivity modulation is not significantly generated and a resistance during conduction is not much reduced in the n⁻ type drift layer 1 that is in contact with the p type collector layer 4B having a low concentration. As a result, the IGBT 52b obtains a high ON voltage performance.

Semiconductor layers that form base bodies of the IGBT 51 and the IGBT 52 are formed of silicon (Si) or silicon carbide (SiC). The gate insulation films 5 are formed of silicon dioxide ($SiO_2$).

In the present embodiment, the IGBT 51b having a low ON voltage and the dual gate IGBT 52b having a high ON voltage are implemented by increasing an impurity concentration in the p type collector layer 4A and reducing an impurity concentration in the p type collector layer 4B. However, an implementing method is not limited thereto. Similar to the second embodiment, the IGBT 51b and the IGBT 52b may be implemented by extending a carrier lifetime in the n⁻ type drift layer 1 in IGBT 51b and shortening a carrier lifetime in the n⁻ type drift layer 1 in the IGBT 52b.

Figure 13:
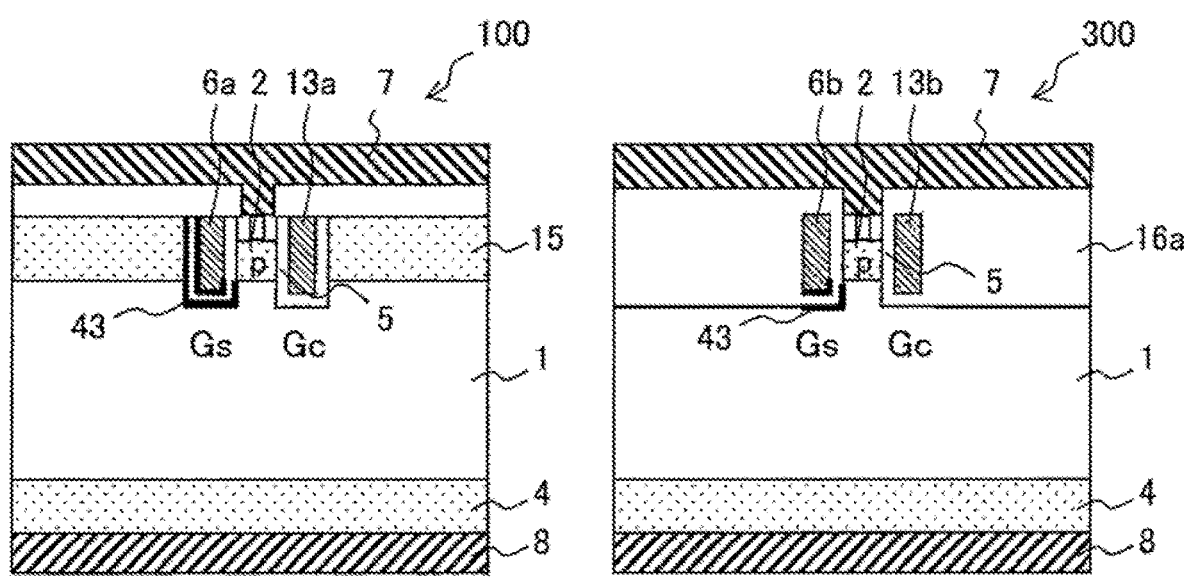
FIG. 13 is a diagram showing an example of respective partial diagrams including dual gate electrode portions of the semiconductor device according to the first embodiment and the semiconductor device according to the third embodiment.

FIG. 13 is a diagram showing an example of respective partial diagrams including dual gate electrode portions of the semiconductor devices 100 according to the first embodiment and the semiconductor device 300 according to the third embodiment. Here, a left diagram is a partial diagram including gate electrodes 6a and 13a in the dual gate semiconductor device 100, and a right diagram is a partial diagram including gate electrodes 6b and 13b in the dual gate semiconductor device 300 according to the third embodiment. The gate electrodes 6a and 6b correspond to the Gs gates 91 in the embodiments described above and the gate electrodes 13a and 13b correspond to the Gc gates 92 in the embodiments described above.

As shown in FIG. 13, one side surface of the trench-shaped gate electrode 6a and one side surface of the trench-shaped gate electrode 13a in the semiconductor device 100 according to the first embodiment are in contact with the n type emitter region 3, the p type well layer 2, and the n⁻ type drift layer 1 via the gate insulation films 5. The other side surface of the gate electrode 6a and the other side surface of the gate electrode 13a are in contact with the p type region 15 having a floating potential and the n⁻ type drift layer 1 via the gate insulation film 5. In contrast, as shown in FIG. 13, only one side surface of the gate electrode 6b of a side wall shape and one side surface of the gate electrode 13b of a side wall shape are in contact with the n type emitter region 3, the p type well layer 2 and the n⁻ type drift layer 1 via the gate insulation films 5 in the semiconductor device 300 according to the present embodiment (the third embodiment).

That is, an area of a portion 43 that is in contact with the n⁻ type drift layer 1 and the p type floating layer 15 via the gate insulation films 5 is smaller in the gate electrodes 6b and 13b of a side wall shape according to the present embodiment than in the trench-shaped gate electrodes 6a and 13a according to the first embodiment. That is, a parasitic capacitance between the gate electrodes 6a and 13a and the n⁻ type drift layer 1 is larger in the first embodiment than in the present embodiment. In particular, the parasitic capacitance between the gate electrode 6a and the n⁻ type drift layer 1 and the parasitic capacitance between the gate electrode 6b and the n⁻ type drift layer 1 act as a feedback capacitance when a switching operation is performed to turn on or turn off the semiconductor devices 100 and 300, and a mirror period in which charging is performed using the feedback capacitance is generated. Therefore, a large parasitic capacitance prevents a current and a voltage from changing at a high speed in the semiconductor devices 100 and 300, and is a main factor to cause an increase in a switching loss.

Since the parasitic capacitance serving as a feedback capacitance is small in the present embodiment as compared with the first embodiment, the current and the voltage can be changed at a high speed during a switching operation in the semiconductor device 300. Therefore, the switching loss can be further reduced in the present embodiment as compared with the first embodiment.

Fourth Embodiment

Figure 14:
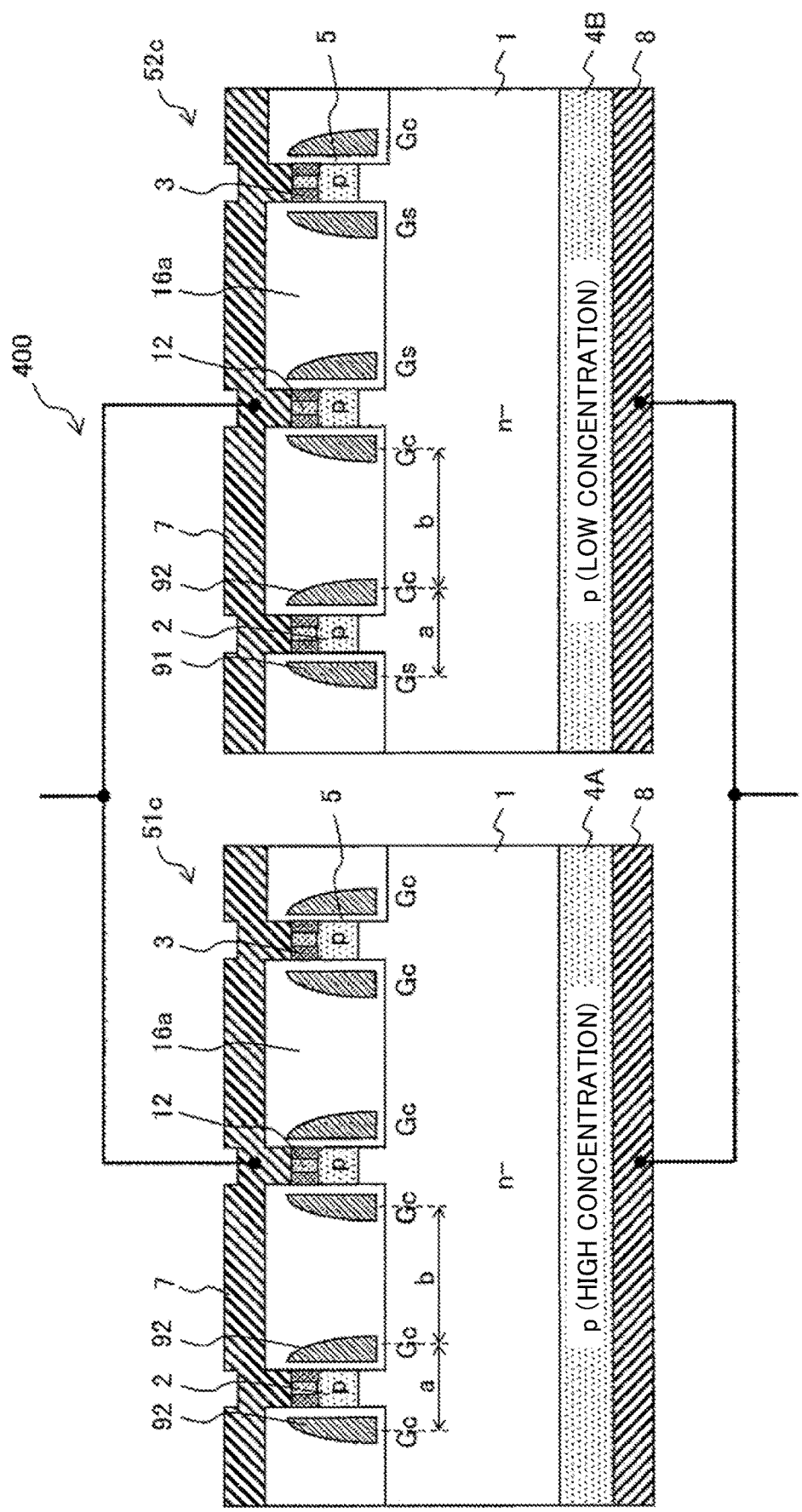
FIG. 14 is a diagram showing an example of a cross-sectional structure of a semiconductor device including two IGBTs that form a semiconductor device according to a fourth embodiment.

FIG. 14 is a diagram showing an example of a cross-sectional structure of a semiconductor device including two IGBTs 51*c* and 52*c* that form a semiconductor device 400 according to the fourth embodiment of the invention. As shown in FIG. 14, a cross-sectional structure of the IGBTs 51*c* and 52*c* according to the present embodiment is only different from a cross-sectional structure (see FIG. 12) of the IGBTs 51*b* and 52*b* according to the third embodiment in a shape of the gate electrodes (the Gs gates 91 and the Gc gates 92).

That is, a cross section of the gate electrodes is a rectangular shape in the IGBTs 51*b* and 52*b* according to the third embodiment and a cross section of the gate electrodes according to the fourth embodiment is a vertical right triangle or a shape in which a hypotenuse portion of the right triangle has an arc shape. In this case, the hypotenuse of the gate electrode having an arc shape is an opposite side to a surface where the gate insulation film 5 is formed in the trench 16*a*, that is, a side where the insulation member is embedded in the wide trench 16*a*. Therefore, a thickness of the gate electrode increases towards a collector electrode 8 side and gradually decreases towards an upper portion, that is, towards an emitter electrode side.

The shape of the cross section of the gate electrode as described above in the present embodiment restricts a manufacturing procedure in a semiconductor manufacturing process. That is, in the IGBTs 51*c* and 52*c* according to the present embodiment, the trench 16*a* is first formed in the base body portion of the semiconductor in which the n⁻ type drift layer 1, the p type well layer 2, then type emitter region 3, and the like are formed. Thereafter, the gate insulation film 5 is formed on an inner surface of the trench 16*a*, a gate electrode member is embedded, and then the gate electrode member other than a gate electrode portion is etched. In this case, a cross-sectional shape of the gate electrode naturally becomes a cross-sectional shape of the gate electrode as shown in FIG. 14.

Since an effect obtained by the semiconductor device 400 according to the present embodiment is substantially the same as the effect obtained by the semiconductor device 300 according to the third embodiment, a description thereof will be omitted.

Figure 15:
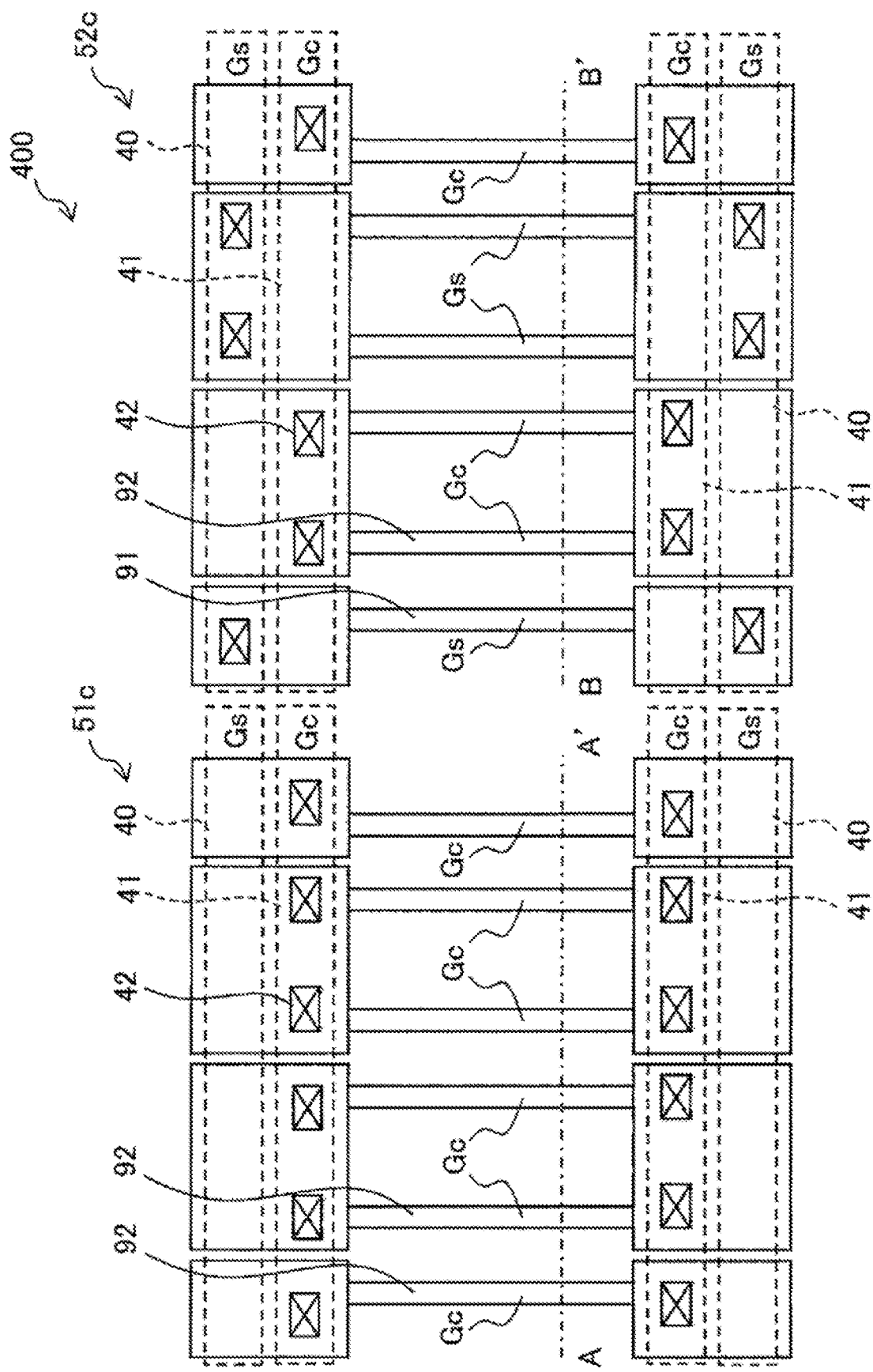
FIG. 15 is a diagram showing a planar arrangement of the two IGBTs that form the semiconductor device according to the fourth embodiment.

FIG. 15 is a diagram showing a planar arrangement of two IGBTs 51*c* and 52*c* that form the semiconductor device 400 according to the fourth embodiment. The cross-sectional structure of the IGBTs 51*c* and 52*c* shown in FIG. 14 corresponds to a cross section of an A-A' portion of the IGBT 51*c* and a cross section of a B-B' portion of the IGBT 52*c* in the planar arrangement view in FIG. 15. In FIG. 15, a region surrounded by a solid line is a region where a gate electrode or a gate electrode material layer is provided, and a region surrounded by a broken line is a region where a metal wire is provided.

In the present embodiment, the dual gate IGBT 52*c* having a high ON voltage includes a plurality of Gs gates 91 and a plurality of Gc gates 92. The Gs gates 91 and the Gc gates 92 can be separately controlled. Therefore, two metal wires 40 and 41 used for respectively supplying control signals to the Gs gates 91 and the Gc gates 92 are provided in the IGBT 52*c*. The metal wires 40 and 41 and gate electrode material layers of the Gs gates 91 and Gc gates 92 are connected via contact layers 42. Therefore, the control signals to the Gs gates 91 and Gc gates 92 are input via the metal wires 40 and 41 and are respectively transmitted to the Gs gates 91 and Gc gates 92 via the contact layers 42.

Positions where the contact layers 42 are provided are in a region (hereinafter, referred to as a gate electrode terminal end portion) where an electrode material layer is provided at a position outside an active region where the gate electrode is formed. The metal wires 40 and 41 are provided at an upper portion of the gate electrode terminal end portion via an insulation layer. The metal wires 40 and 41 and the gate electrode layer of the terminal portion are connected via the contact layers 42 that are a layer of a hole portion formed in the insulation layer. Therefore, one of the Gs gate 91 and the Gc gate 92 is connected to one of the metal wires 40 and 41 provided at the upper portion of the gate electrode terminal end portion, so that the gate electrodes can be easily selected according to an arrangement of the contact layers 42.

As shown in FIG. 14, since the IGBT 51*c* having a low ON voltage has substantially the same cross-sectional structure as the dual gate IGBT 52*c* having a high ON voltage, the IGBT 51*c* may also have substantially the same planar arrangement (layout) configuration as the IGBT 52*c*. As can be seen from FIG. 15, the planar arrangement of the dual gate IGBT 52*c* having a high ON voltage and the planar arrangement of the IGBT 51*c* having a low ON voltage are only different in that positions of the contact layers 42 are changed.

The planar arrangement configuration described with reference to FIG. 15 corresponds to the semiconductor device 400 having the cross-sectional structure shown in FIG. 14. Similarly, the planar arrangement configuration also corresponds to the semiconductor devices 100, 200, and 300 having the cross-sectional structures shown in FIG. 2, FIG. 9, and FIG. 12.

Modification of Fourth Embodiment

Figure 16:
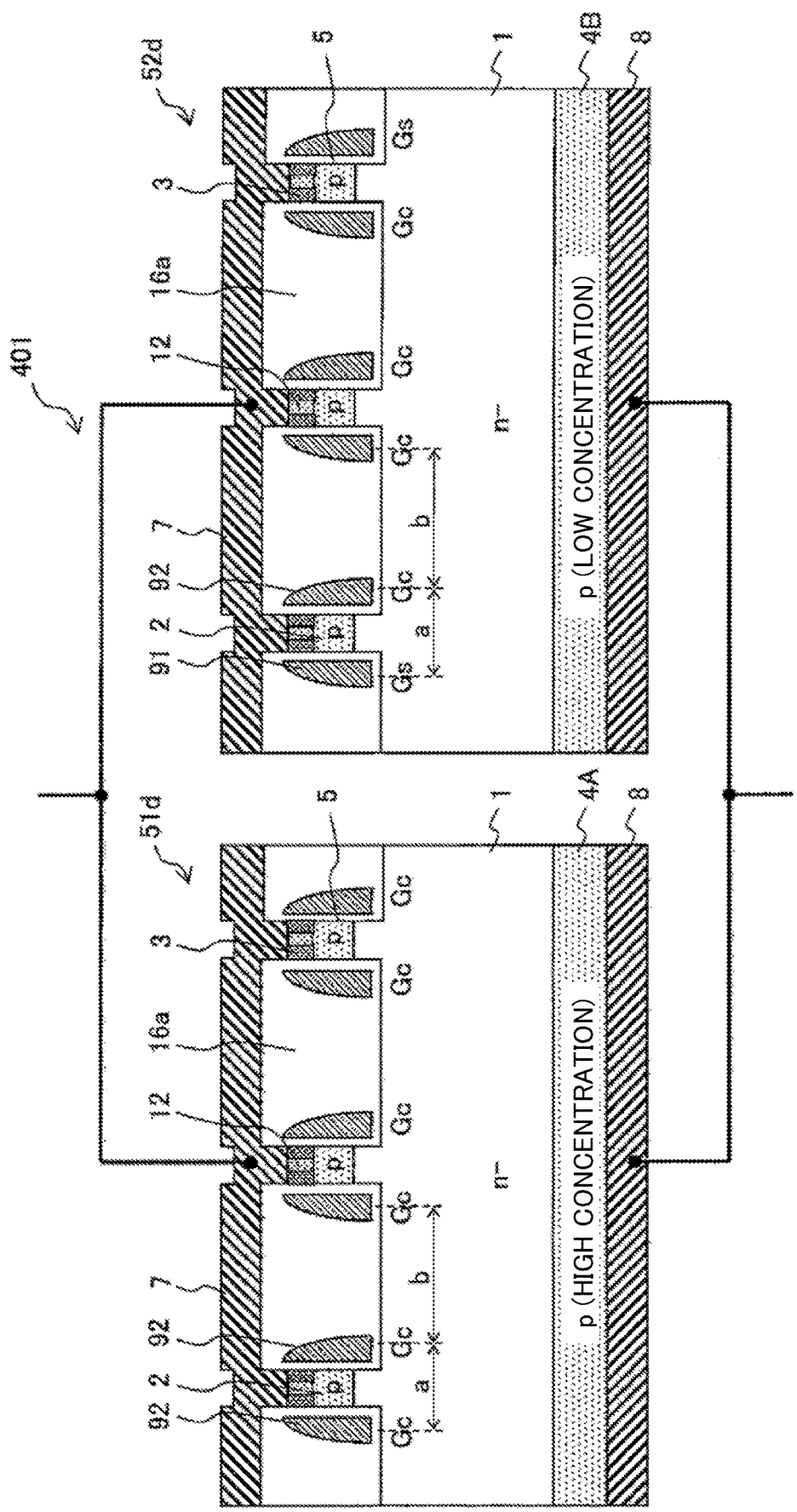
FIG. 16 is a diagram showing an example of a cross-sectional structure of a semiconductor device including two IGBTs that form a semiconductor device according to a modification of the fourth embodiment.
Figure 17:
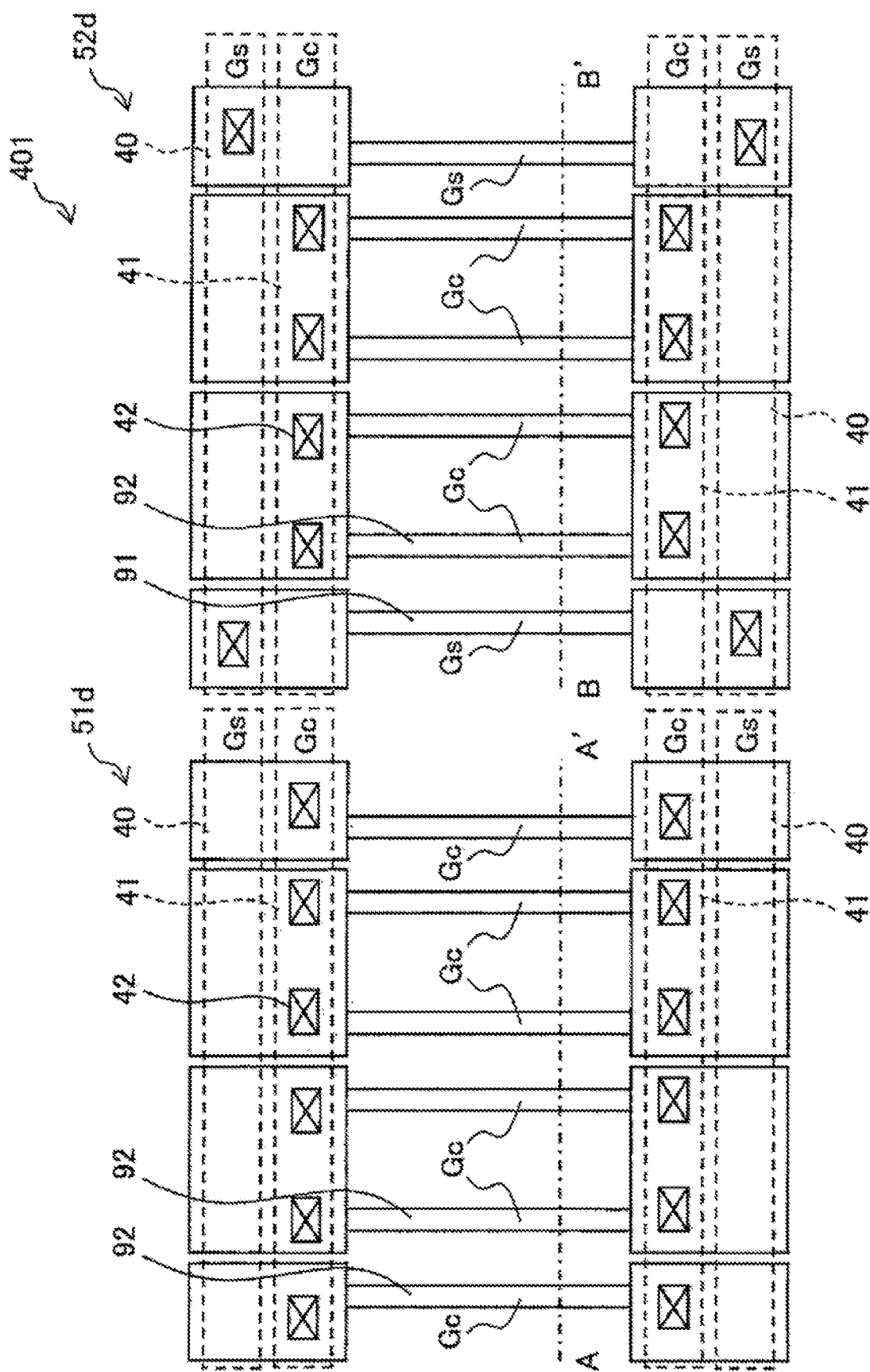
FIG. 17 is a diagram showing a planner arrangement of the two IGBTs shown in FIG. 16.

FIG. 16 is a diagram showing an example of a cross-sectional structure of a semiconductor device including two IGBTs 51*d* and 52*d* that form a semiconductor device 401 according to the modification of the fourth embodiment of the invention. FIG. 17 is a diagram showing an example of a planar arrangement of the two IGBTs 51*d* and 52*d* shown in FIG. 16.

A number ratio of the Gc gates 92 to the Gs gates 91 that are formed in the dual gate IGBT 52*d* having a high ON voltage according to the present modification is different from a number ratio in the fourth embodiment. The number ratio of the Gc gates 92 to the Gs gates 91 that are formed in the IGBT 52*c* is 1:1 in the fourth embodiment. In contrast, the number of the Gc gates 92 is increased and the number ratio of the Gc gates 92 to the Gs gates 91 is, for example, 2:1 in the present modification. Such a change in the number ratio of the Gc gates 92 to the Gs gates 91 can be easily implemented by changing a part of the arrangement of the contact layers 42.

In the present modification, a controllability of a carrier concentration in the IGBT 52*d* by the Gc gates 92 can be further improved by increasing the number ratio of the Gc gates 92 in the dual gate IGBT 52d having a high ON voltage. That is, carriers are accumulated inside the n⁻ type drift layer 1 at a high concentration by applying a voltage equal to or higher than a threshold voltage to the Gc gates 92 during conduction. Most accumulated hole carriers are discharged to the emitter electrode 7 through hole accumulation layers formed in the p type well layer 2 that are in contact with the Gc gates 92 having a high number ratio by applying a voltage lower than the threshold voltage to the Gc gates 92.

Accordingly, a depletion speed is increased and a collector-emitter voltage increasing speed is increased at the time of turn-off. Therefore, a power loss during a voltage increasing period at the time of turn-off can be reduced. On the other hand, a high collector-emitter voltage increasing speed is likely to generate switching noises or a power loss is generated due to a temporary increase of an ON voltage right before turn-off. Therefore, the ratio number of the Gc gates 92 to the Gs gates 91 is an optimum value respectively corresponding to a rated voltage and a rated current of the semiconductor device 401. According to the present modification, the optimum number ratio can be easily implemented by changing the arrangement of the contact layers 42.

Therefore, an optimum number ratio can be easily implemented, and a conductivity modulation prevention effect can be further improved by applying a voltage to the Gc gates 92 while maintaining a low conduction loss in the present modification. The semiconductor device 401 having low power consumption in which both a conduction loss and a turn-off loss are further reduced can be implemented.

Fifth Embodiment

Figure 18A:
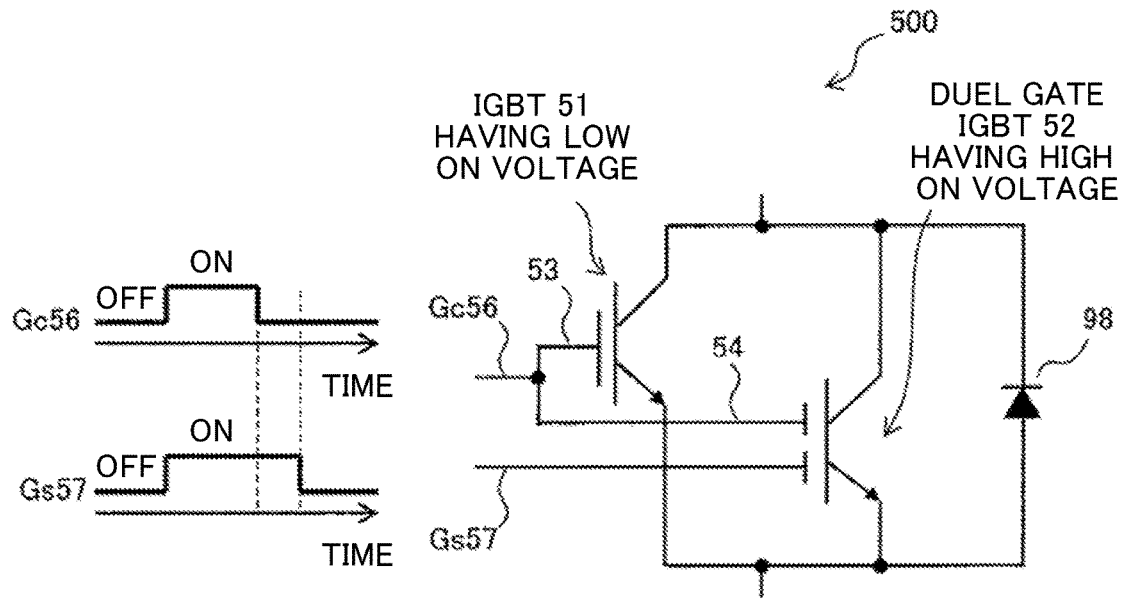
Figure 18B:
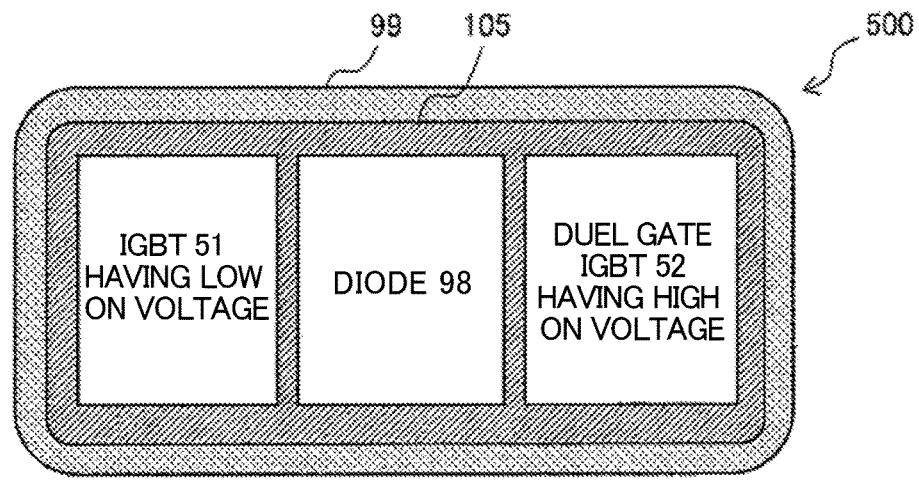
Figure 18C:
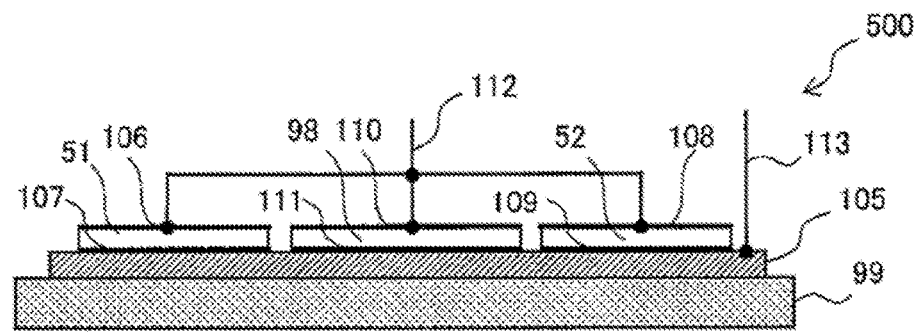

FIG. 18 is a diagram showing configuration examples of a semiconductor device 500 according to the fifth embodiment of the invention. FIG. 18(a) shows an example of a circuit configuration of the semiconductor device 500. FIG. 18(b) shows an example of a planar arrangement configuration of the semiconductor device 500. FIG. 18(c) shows an example of a cross-sectional configuration. As shown in FIG. 18, the semiconductor device 500 according to the present embodiment includes the IGBT 51 having a low ON voltage, the dual gate IGBT 52 having a high ON voltage, and a diode 98 serving as a rectification element. That is, in the semiconductor device 500, the diode 98 serving as a rectification element is connected in parallel to the semiconductor device 100 according to the first embodiment. Although the diode 98 in the semiconductor device 500 is connected in parallel to the semiconductor device 100 according to the first embodiment, the invention is not limited thereto. Alternatively, the diode 98 may be connected to the semiconductor device 200 according to the second embodiment, the semiconductor device 300 according to the third embodiment, or the semiconductor device 400 according to the fourth embodiment.

In the configuration of the semiconductor device 500 as described above, a current can flow from a collector side to an emitter side in the semiconductor device 100, and a current can also flow from the emitter side to the collector side. Therefore, a power converter such as an inverter can be easily implemented by using the semiconductor device 500.

The diode 98 may be a diode including a PN joint formed by dropping impurities in a Si substrate or a SiC substrate, or a diode including a joint of an impurity dropping layer and a metal Schottky barrier. The diode 98 may be a single element, or may be one in which a plurality of small elements are mounted in parallel.

Next, the two IGBTs 51 and 52 and the diode 98 are joined onto a conductive thin film 105 formed on the same insulation substrate 99 as shown in FIG. 18(b). A solder or the like is used for the joining. The diode 98 is disposed between the IGBT 51 having a low ON voltage and the dual gate IGBT 52 having a high ON voltage. The IGBTs 51 and 52 may be arranged in a reversed right-left manner.

As shown in FIG. 18(c), a collector electrode 107 of the IGBT 51, a collector electrode 109 of the IGBT 52, and a cathode electrode 111 of the diode 98 are electrically connected via the conductive thin film 105. A terminal 113 is provided at an end portion of the conductive thin film 105. In addition, an emitter electrode 106 of the IGBT 51, an emitter electrode 108 of the IGBT 52, and an anode electrode 110 of the diode 98 are electrically connected by a conductive wire formed of a material such as aluminum and copper, and are connected to a terminal 112.

The terminal 112 is a conductive wire formed of a material such as aluminum and copper. An electrical signal is applied between the terminal 112 and the terminal 113 formed on the conductive thin film 105. In this manner, the two IGBTs 51 and and the diode 98 are connected in parallel to form the semiconductor device 500 in which a current can flow in two directions. Terminals that input the gate control signals Gc 56 and Gs 57 are omitted here.

In the present embodiment, since the diode 98 is interposed between the two IGBTs 51 and 52, heat caused by power that is generated by operating each element is prevented from concentrating. In the IGBTs 51 and 52, power is consumed by a current flowing during conduction and a voltage during conduction, and power is consumed by a change in a transient current and voltage at the time of switching between turn-off and turn-on. Therefore, the IGBTs 51 and 52 generate heat corresponding to a relationship between consumed power and surrounding heat resistance.

Since the IGBTs 51 and 52 having large power consumption are provided outward than the diode 98 having low power consumption, heat generated in the IGBTs 51 and 52 is easily dissipated to an outer peripheral portion. As a result, a heat amount flowing from a side close to the IGBTs 51 and 52 to a side close to the diode is reduced. Therefore, heat can be prevented from concentrating in a central portion of the semiconductor device 500.

Accordingly, temperatures of the IGBTs 51 and 52 and the diode 98 that form the semiconductor device 500 can be prevented from rising. As a result, reliability of the semiconductor device 500 can be improved and an effect of increasing an allowable current can be expected. Therefore, the semiconductor device 500 having a characteristic of achieving both a low conduction loss and a low turn-off loss and having high reliability is implemented according to the present embodiment.

Sixth Embodiment

Figure 19:
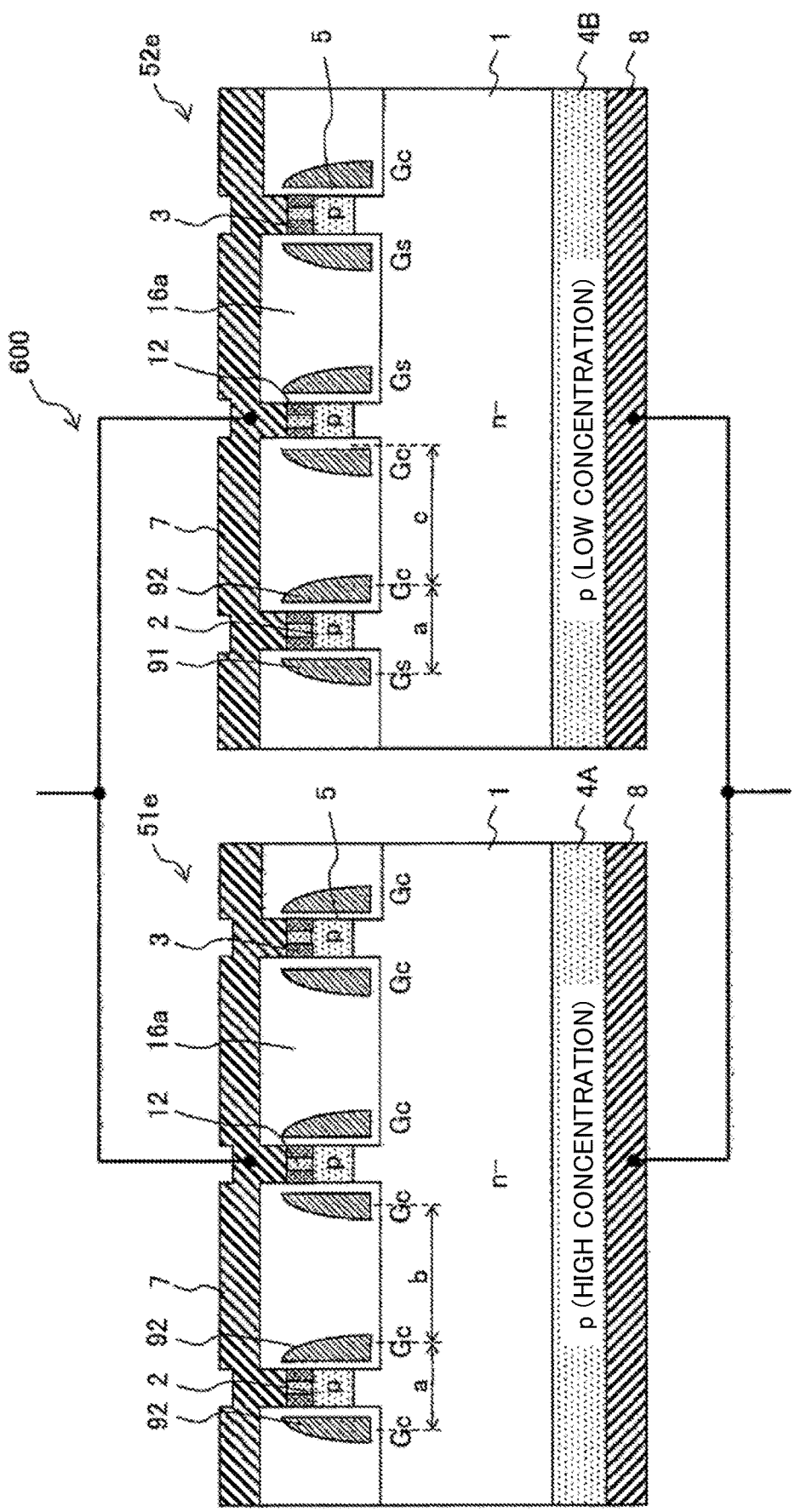
FIG. 19 is a diagram showing an example of a cross-sectional structure of a semiconductor device including two IGBTs that form a semiconductor device according to a sixth embodiment.

FIG. 19 is a diagram showing an example of a cross-sectional structure of a semiconductor device including two IGBTs 51e and 52e that form a semiconductor device 600 according to the sixth embodiment of the invention. As shown in FIG. 19, the cross-sectional structure of the semiconductor device 600 according to the present embodiment is different from that in the fourth embodiment as shown in FIG. 14 in an interval c between two gate electrodes formed at two end portions of the same trench 16a in the IGBT 52e.

That is, an interval between gate electrodes formed at two end portions of the same trench 16a in the IGBT 52c is b in the fourth embodiment, and an interval between gate electrodes formed at two end portions of the same trench 16a in the IGBT 52e is c in the present embodiment. Other than the interval c, since a cross-sectional structure of the IGBT 51e and the IGBT 52e according to the present embodiment is the same as a cross-sectional structure of the IGBT 51c and the IGBT 52c according to the fourth embodiment, a description thereof is omitted.

In the IGBT 51e according to the present embodiment, the interval a between two electrodes sandwiching the p type well layer 2 is set to be shorter than the interval b between gate electrodes formed at sides where the p type well layer 2 is not provided, that is, at two end portions of the same trench 16a (b>a). In the IGBT 52e, the interval a between two gate electrodes sandwiching the p type well layer 2 is set to be shorter than the interval c between gate electrodes formed at sides where the dual gate p type well layer 2 is not provided, that is, at two end portions of the same trench 16a (c>a). In addition, a relationship b>c is satisfied.

Figure 20:
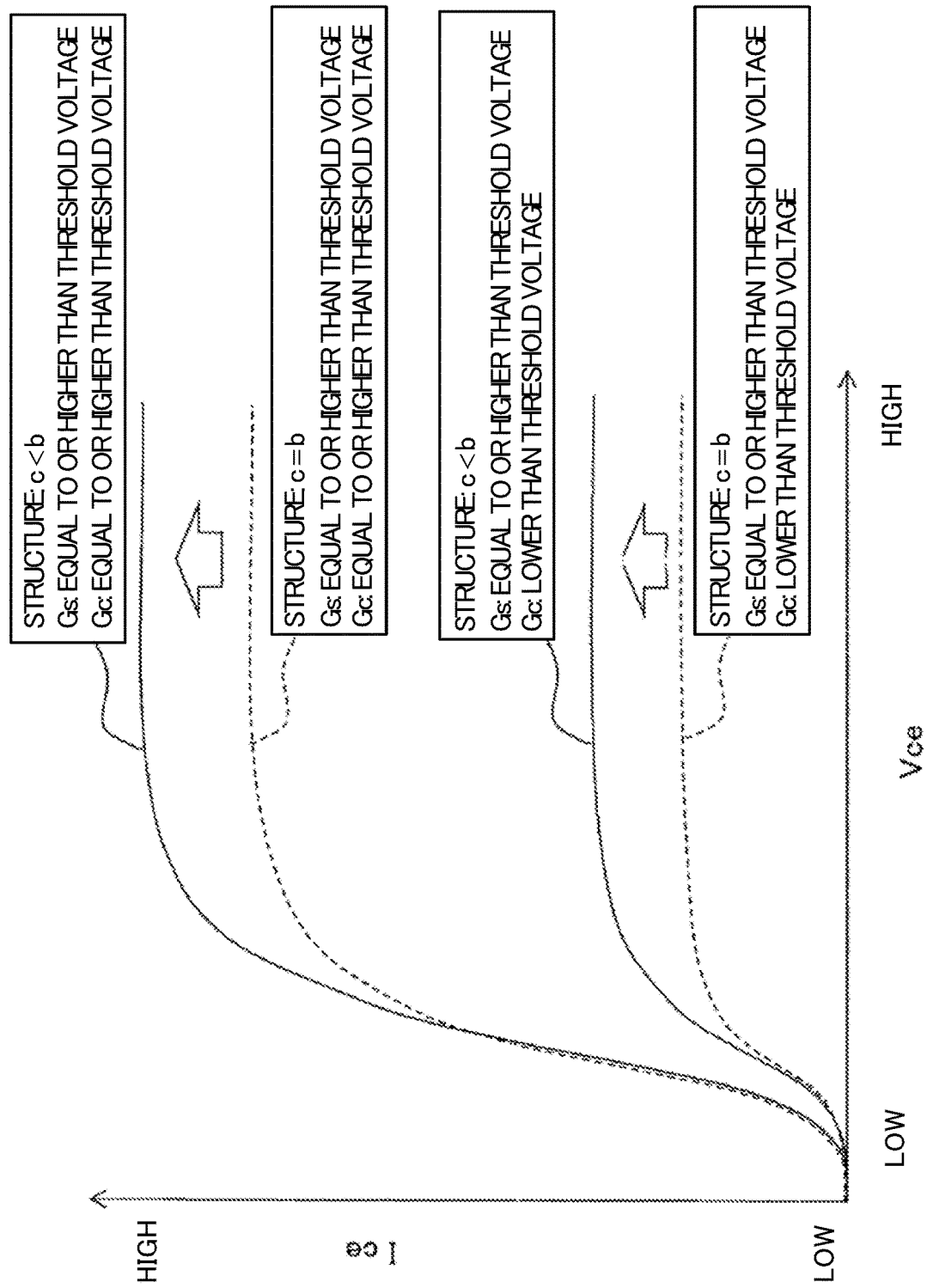
FIG. 20 is a diagram showing a forward characteristic of a collector-emitter current (Ice) obtained by the semiconductor device according to the sixth embodiment.

FIG. 20 is a diagram showing a forward characteristic of a collector-emitter current (Ice) obtained by the semiconductor device 600 according to the sixth embodiment of the invention. A solid line indicates a forward characteristic obtained by the semiconductor device 600 (c<b) according to the present embodiment, and a broken line indicates a forward characteristic obtained by the semiconductor device 400 (c=b) according to the fourth embodiment. It can be easily understood from FIG. 20 that a saturation current of the semiconductor device 600 (c<b) according to the present embodiment is larger than a saturation current of the semiconductor device 400 (c=b) according to the fourth embodiment.

A relative increase rate between the semiconductor device 600 (c<b) and the semiconductor device 400 (c=b) is large when a voltage lower than a threshold voltage is applied to the Gc gates 92 and a voltage equal to or higher than the threshold voltage is applied to the Gs gates 91 as compared with a case in which a voltage equal to or higher than the threshold voltage is applied to both the Gc gates 92 and the Gs gates 91. This is because the number of gate electrodes per unit area increases in the IGBT 52e. Therefore, both a low ON voltage performance and a low turn-off loss performance can be achieved by using a control of applying a voltage equal to or higher than the threshold voltage or a voltage lower than the threshold voltage to the Gc gates 92 in the IGBT 52e. A maximum value of a current allowed to flow in the semiconductor device 600 is determined by a saturation current performance when a voltage lower than the threshold voltage is applied to the Gc gates 92.

That is, in the present embodiment, if the saturation current can be increased under a condition in which a voltage lower than the threshold voltage is applied to the Gc gates 92 and a voltage equal to or higher than the threshold voltage is applied to the Gs gates 91, an allowable current allowed to flow in the semiconductor device 600 increases. Accordingly, a current capacity can be increased. In addition, the number of gate electrodes in the dual gate IGBT 52e having a high ON voltage can be increased in the present embodiment. Therefore, compared with the semiconductor device 400 according to the fourth embodiment in which a relationship of b=c is satisfied, an effective channel width per unit area increases and the saturation current increases particularly under a condition in which a voltage lower than the threshold voltage is applied to the Gc gates 92 and a voltage equal to or higher than the threshold voltage is applied to the Gs gates 91. Accordingly, a current capacity can be increased.

As described above, the semiconductor device 600 in which both a low conduction loss and a low turn-off loss can be achieved and a current capacity can be increased is implemented according to the present embodiment.

Seventh Embodiment

Figure 21:
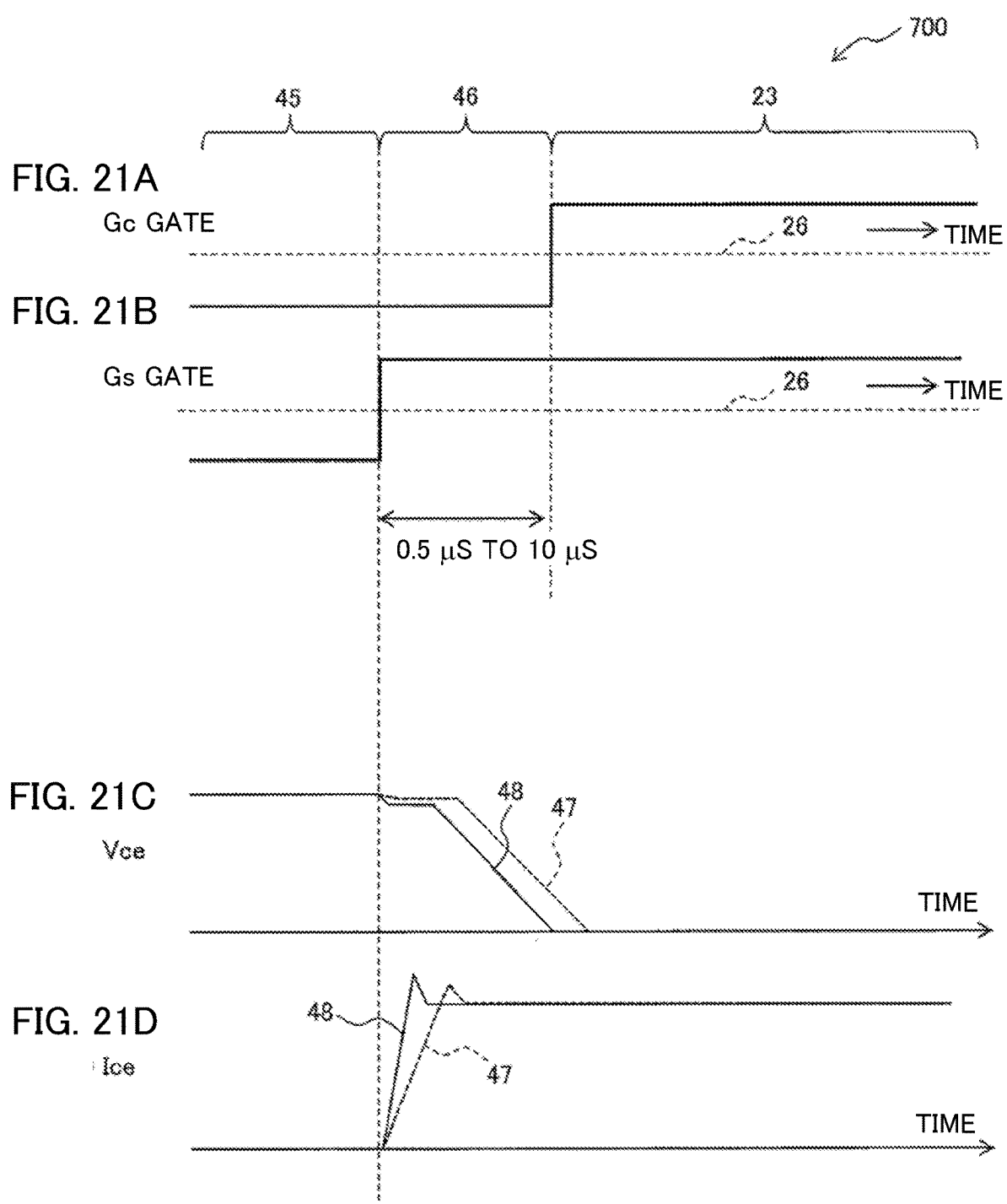

FIG. 21 is a diagram showing an example of operation waveforms when the semiconductor device 100 according to the first embodiment of the invention is turned on. Here, FIG. 21 (a) shows an example of a Gc gate drive signal waveform, FIG. 21(b) shows an example of a Gs Gate drive signal waveform, FIG. 21(c) shows an example of a collector-emitter voltage (Vce) waveform, and FIG. 21(d) shows an example of a collector-emitter current (Ice) waveform. The operation waveforms shown in FIG. 21 are the same in the semiconductor devices 200, 300, 400, 401, and 600 described in the second and subsequent embodiments.

As shown in FIG. 21, both a drive signal of the Gc gates 92 and a drive signal of the Gs gates 91 are lower than a threshold voltage 26 and no channel is formed in the p type well layers 2 during a non-conducting period 45 of the semiconductor device 100. Therefore, the collector-emitter voltage (Vce) is high. Next, a voltage equal to or higher than the threshold voltage 26 is only applied to the Gs gates 91 during a turn-on period 46. Accordingly, a channel is only formed at the Gs gate 91 side and the semiconductor device 100 is in a conducting state. The semiconductor device 100 can be turned on with a low transconductance (gm) as compared with a case in which a voltage equal to or higher than the threshold voltage 26 is simultaneously applied to the Gc gates 92 and the Gs gates 91.

As a result, a time change dv/dt of a collector-emitter voltage (Vce) caused by turning on can be reduced. It is easy to deal with induced noises, motor insulation, and the like which are problems in application of a power conversion device caused by the dv/dt.

Since the dv/dt is reduced in a turn-on driving in which the Gc gates 92 and the Gs gates 91 are simultaneously controlled to have the threshold voltage 26, it is required to connect a gate resistor in series to the Gs gates 91 and the Gc gates 92 in the semiconductor device 100. However, it is not easy to reduce a change di/dt of a collector-emitter current (Ice) in the semiconductor device 100 by using the gate resistor. Therefore, there is a side effect that a turn-on loss increases at a side where the dv/dt is reduced.

In a waveform of a collector-emitter voltage (Vce) as shown in FIG. 21 (c) and a waveform of a collector-emitter current (Ice) as shown in FIG. 21(d), a solid line waveform 48 is a waveform obtained by a drive signal according to the present embodiment. On the other hand, a broken line waveform 47 is a waveform obtained when the Gc gates 92 and the Gs gates 91 are simultaneously controlled to have a voltage equal to or higher than the threshold voltage 26 and are driven through the gate resistor.

A turn-on driving is performed in which a voltage equal to or higher than the threshold voltage is applied to the Gs gates 91 prior to the Gc gates 92 in the present embodiment. Therefore, the di/dt with the same dv/dt can be increased as compared with a driving in which resistances are applied to the Gc gates 92 and the Gs gates 91 and a voltage equal to or higher than the threshold voltage is simultaneously applied to the Gc gates 92 and the Gs gates 91. Therefore, a turn-on loss can be reduced.

It is desirable that the turn-on period 46 is 0.5 µs to 10 µs. In addition, a drive control in the conducting period 23, the period 24 right before turn-off, and the turn-off period 25 as shown in FIG. 6 is the same as a drive control described in the first embodiment, and a low conduction loss and a low turn-off loss can be simultaneously achieved by the drive control.

Modification of Seventh Embodiment

Figure 22:
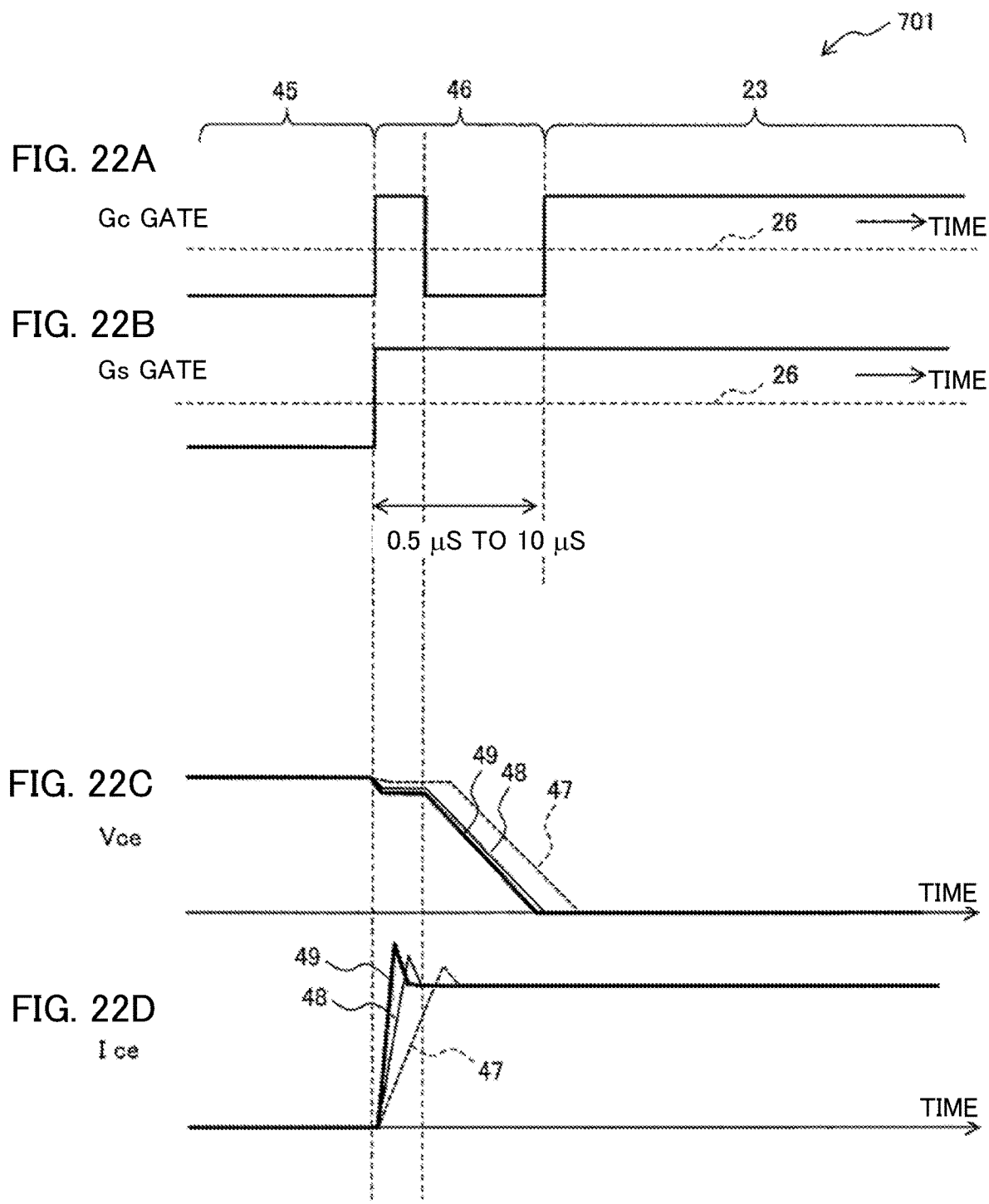

FIG. 22 is a diagram showing operation waveforms according to a modification when the semiconductor device 100 according to the first embodiment of the invention is turned on. Here, FIG. 22(a) shows an example of a Gc gate drive signal waveform, FIG. 22(b) shows an example of a Gs Gate drive signal waveform, FIG. 22(c) shows an example of a collector-emitter voltage (Vce) waveform, and FIG. 22(d) shows an example of a collector-emitter current (Ice) waveform. The operation waveforms shown in FIG. 22 are the same in the semiconductor devices 200, 300, 400, 401, and 600 described in the second and subsequent embodiments.

As shown in FIG. 22, both a drive signal of the Gc gates 92 and a drive signal of the Gs gates 91 are lower than the threshold voltage 26 and no channel is formed in the p type well layers 2 during the non-conducting period 45 of the semiconductor device 100. Therefore, the collector-emitter voltage (Vce) is high.

Next, during the turn-on period 46, first, a voltage equal to or higher than the threshold voltage 26 is simultaneously applied to the Gs gates 91 and the Gc gates 92. Subsequently, only an applied voltage of the Gc gates 92 is temporarily reduced to be lower than the threshold voltage 26. Thereafter, the applied voltage of the Gc gates 92 is again increased to be equal to or higher than the threshold voltage 26.

The following effects can be obtained by controlling the applied voltage to the Gs gates 91 and the Gc gates 92 as described above. First, during a period in which a collector-emitter current (Ice) increases and a di/dt increases, channels are generated at both Gs sides and Gc sides and a carrier injection efficiency is improved, so that the di/dt can be increased. During the period in which the collector-emitter current (Ice) increases and the di/dt increases, channels are formed at both a Gc gate 92 side and a Gs gate 91 side, and a carrier injection efficiency is improved, so that the di/dt can be increased. On the other hand, during a period in which a collector-emitter voltage (Vce) is reduced and a dv/dt increases, a channel is formed only at the Gs gate 91 side, and carriers are injected, so that a transconductance gm is reduced and the dv/dt is appropriately controlled.

FIG. 22(c) and FIG. 22(d) show turn-on waveforms of the collector-emitter voltage (Vce) and the collector-emitter current (Ice) using the following three turn-on drive control methods. A turn-on waveform of a thin broken line 47 is a turn-on waveform obtained when a voltage equal to or higher than the threshold voltage 26 simultaneously drives the Gs gates 91 and the Gc gates 92 through a gate resistor. A turn-on waveform of a thin solid line 48 is a turn-on waveform obtained using a gate electrode driving method (see FIG. 21) in which a voltage equal to or higher than the threshold voltage is applied to the Gs gates 91 prior to the Gc gates 92. A turn-on waveform of a thick solid line 49 is a turn-on waveform obtained using a driving method (see FIG. 22(a) and FIG. 22(b)) in which a voltage equal to or higher than the threshold voltage 26 is simultaneously applied to the Gs gates 91 and the Gc gates 92, then only an applied voltage of the Gc gates 92 is temporarily reduced to be lower than the threshold voltage 26, and thereafter, the voltage equal to or higher than the threshold voltage 26 is again applied to the Gc gates 92.

Since there is a period in which a voltage equal to or higher than the threshold voltage is applied to the Gs gates 91 prior to the Gc gates 92 in a case of the driving method shown in FIG. 22 (a) and FIG. 22 (b), the dv/dt can be appropriately reduced. In addition, the di/dt can be further increased by applying a voltage equal to or higher than the threshold voltage to both the Gc gates and the Gs gates 91 during a period in which the collector-emitter current (Ice) changes. As a result, a turn-on loss can be reduced.

It is desirable that the turn-on period 46 is 0.5 µs to 10 µs. In addition, a drive control in the conducting period 23, the period 24 right before turn-off, and the turn-off period 25 as shown in FIG. 6 is the same as a drive control described in the first embodiment, and a low conduction loss and a low turn-off loss can be simultaneously achieved by the drive control.

Eighth Embodiment

Figure 23:
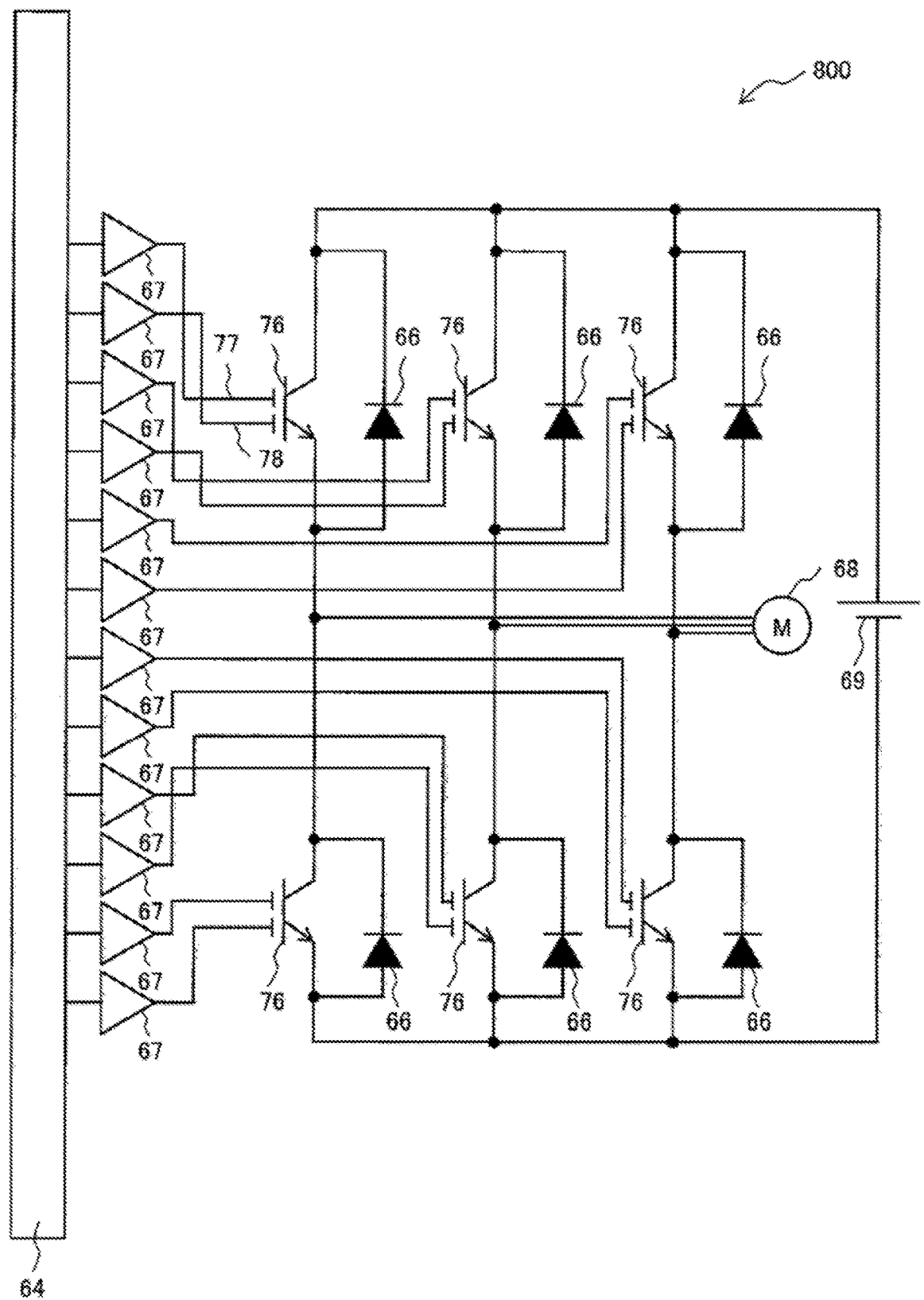
FIG. 23 is a diagram showing an example of a circuit configuration in a power conversion device according to an eighth embodiment.

FIG. 23 is a diagram showing an example of a circuit configuration in a power conversion device 800 according to the eighth embodiment of the invention. The power conversion device 800 according to the present embodiment includes IGBTs 76 serving as an upper arm and a lower arm of a three-phase alternating current, diodes 66, and the drive circuits 67 that drive the IGBTs 76 according to IGBT command signals from the control circuit 64.

The IGBT 76 is the semiconductor device 100 including the IGBT 51 having a low ON voltage and the dual gate IGBT 52 having a high ON voltage as described in the first embodiment, and includes a Gs gate 77 and a Gc gate 78 used for controlling turn-on and turn-off of the semiconductor device 100.

The Gs gate 77 and the Gc gate 78 shown in FIG. 23 correspond to the Gs gate 91 and the Gc gate 92 in the cross-sectional structure shown in FIG. 2. The IGBT 76 is not limited to the semiconductor device 100 according to the first embodiment, and may be the semiconductor devices 200, 300, 400, 401, 600 according to the second to seventh embodiments, or the like.

The power conversion device 800 is, for example, an inverter that drives the inductive load 68 such as a motor, converts electric power of the direct current power supply 69 into electric power having a three-phase alternating voltage including a U phase, a V phase, and a W phase, and supplies the electric power to the three-phase alternating inductive load 68. In this case, three sets each including two IGBTs 76 connected in series are provided between a positive side and a negative side of the direct current power supply 69. The three-phase alternating voltage including the U phase, the V phase, and the W phase is output from a position where an emitter of the IGBT 76 at the positive side and a collector of the IGBT 76 at the negative side are connected.

The drive circuit 67 includes, as a main constituent element, a level shift circuit that converts a signal input from the control circuit 64 into an input signal for the Gs gate 77 and an input signal for the Gc gate 78 in the IGBT 76. The control circuit 64 has a function of generating a timing signal for driving the inductive load 68. That is, the control circuit 64 generates a drive control signal for the Gs gate 77 and a drive control signal for the Gc gate 78 at an optimum timing so as to achieve a low loss performance in the IGBT 76. The drive control signals are generally referred to as pulse width modulation (PWM) signals having a modulated pulse width.

Since the power conversion device 800 according to the present embodiment includes the semiconductor devices 100, 200, 300, 400, 401, and 600 described in the first to seventh embodiments, the power conversion device 800 has a low loss performance. Accordingly, the power conversion device having a low power loss and high efficiency can be implemented.

Modification of Eighth Embodiment

Figure 24:
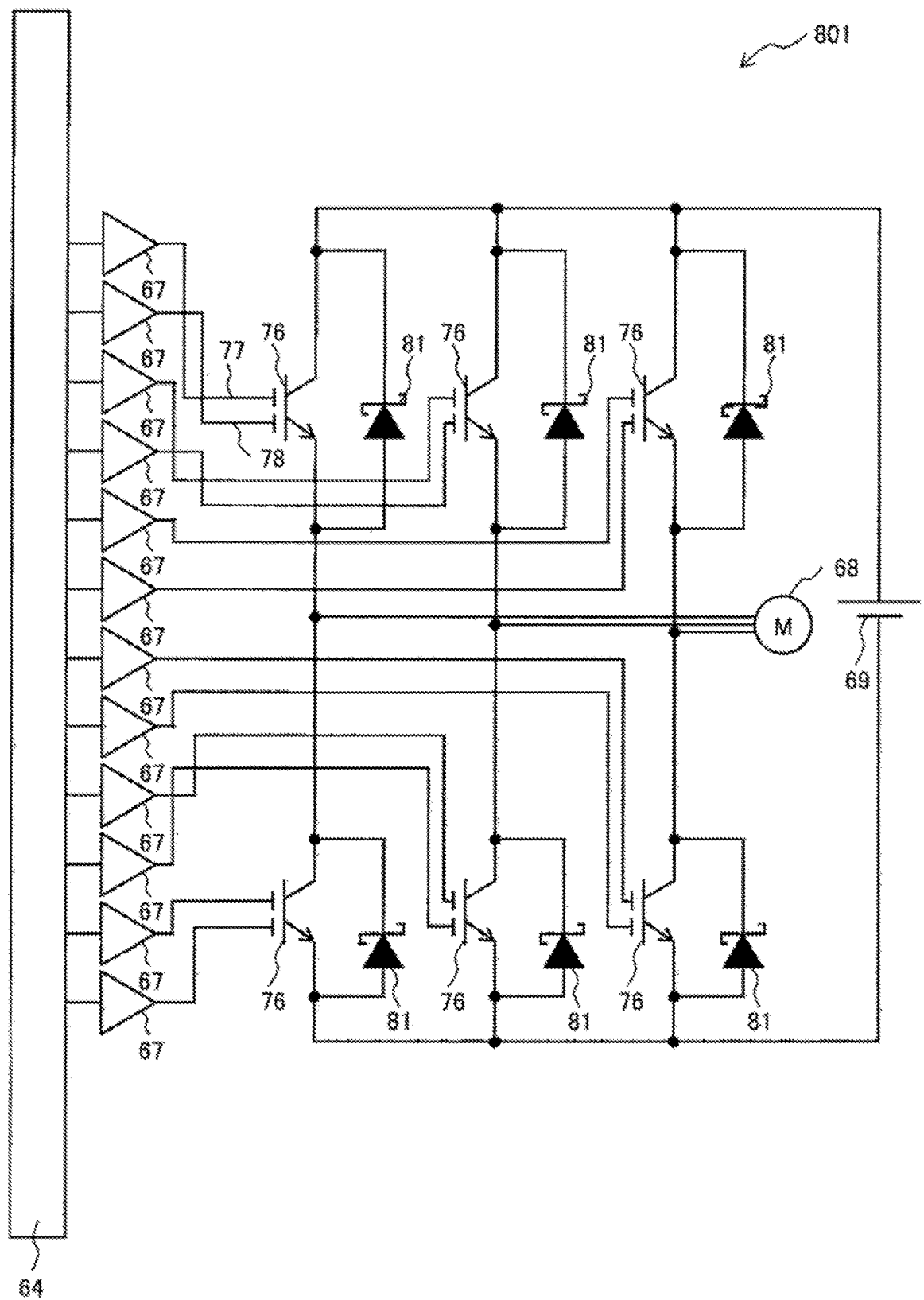
FIG. 24 is a diagram showing an example of a circuit configuration of a power conversion device according to a modification of the eighth embodiment.

FIG. 24 is a diagram showing an example of a circuit configuration of a power conversion device 801 according to a modification of the eighth embodiment of the invention. A configuration of the power conversion device 801 according to the present modification is substantially the same as a configuration of the power conversion device 800 according to the eighth embodiment except for the following points. That is, the pn joint diodes 66 are respectively connected in antiparallel to the IGBTs 76 in the power conversion device 800 according to the eighth embodiment while Schottky barrier diodes 81 are connected to the IGBTs 76 in the present modification. An example of a material of the Schottky barrier diodes 81 includes silicon carbide (SiC) crystal.

Therefore, an operation and a function of the power conversion device 801 according to the present modification are substantially the same as those of the power conversion device 800 according to the eighth embodiment. Therefore, similar to the power conversion device 800 according to the eighth embodiment, the power conversion device 801 according to the present modification can also achieve a low power loss and high efficiency.

Second Modification of Eighth Embodiment

Figure 25:
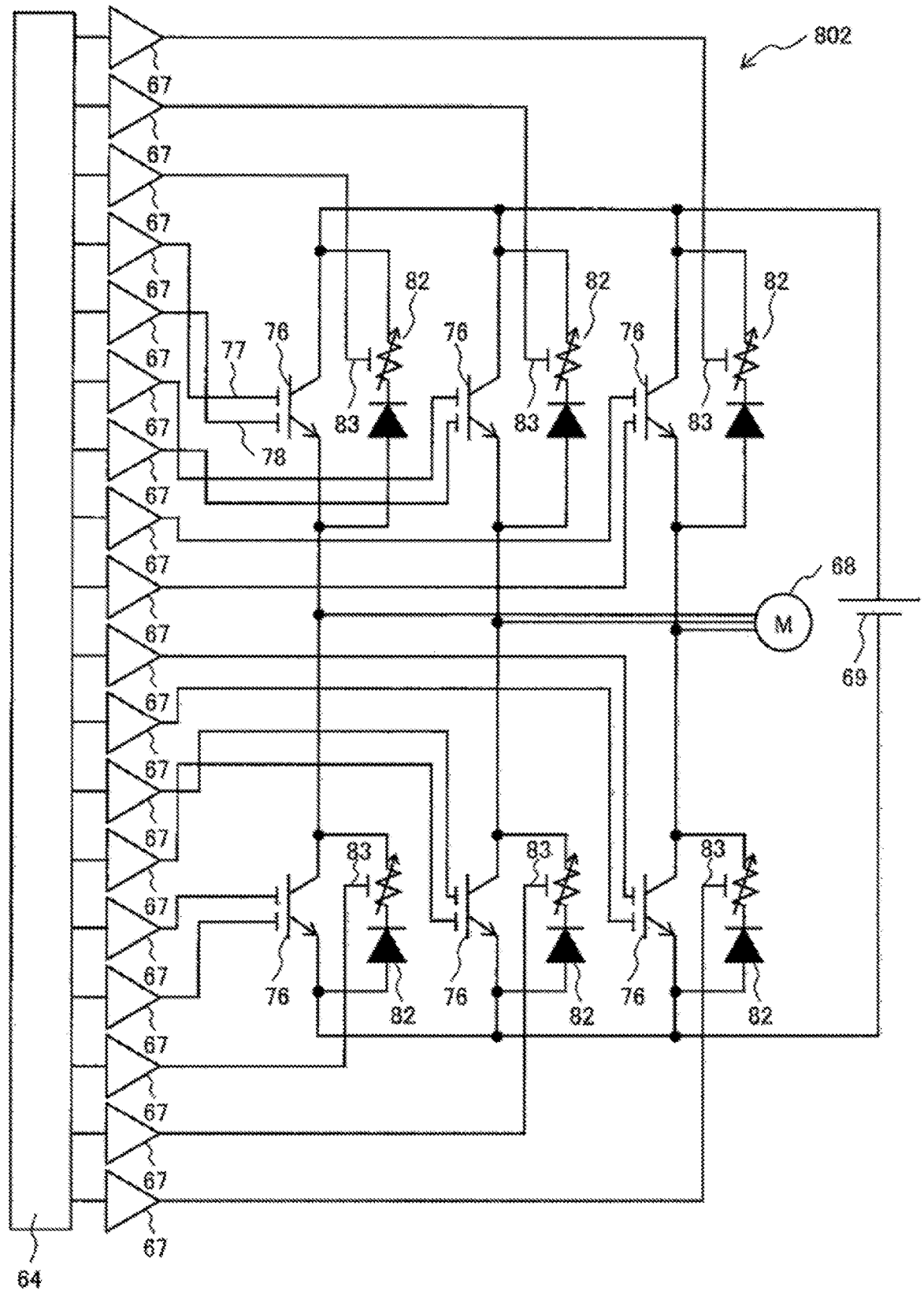
FIG. 25 is a diagram showing an example of a circuit configuration of a power conversion device according to a second modification of the eighth embodiment.
Figure 26:
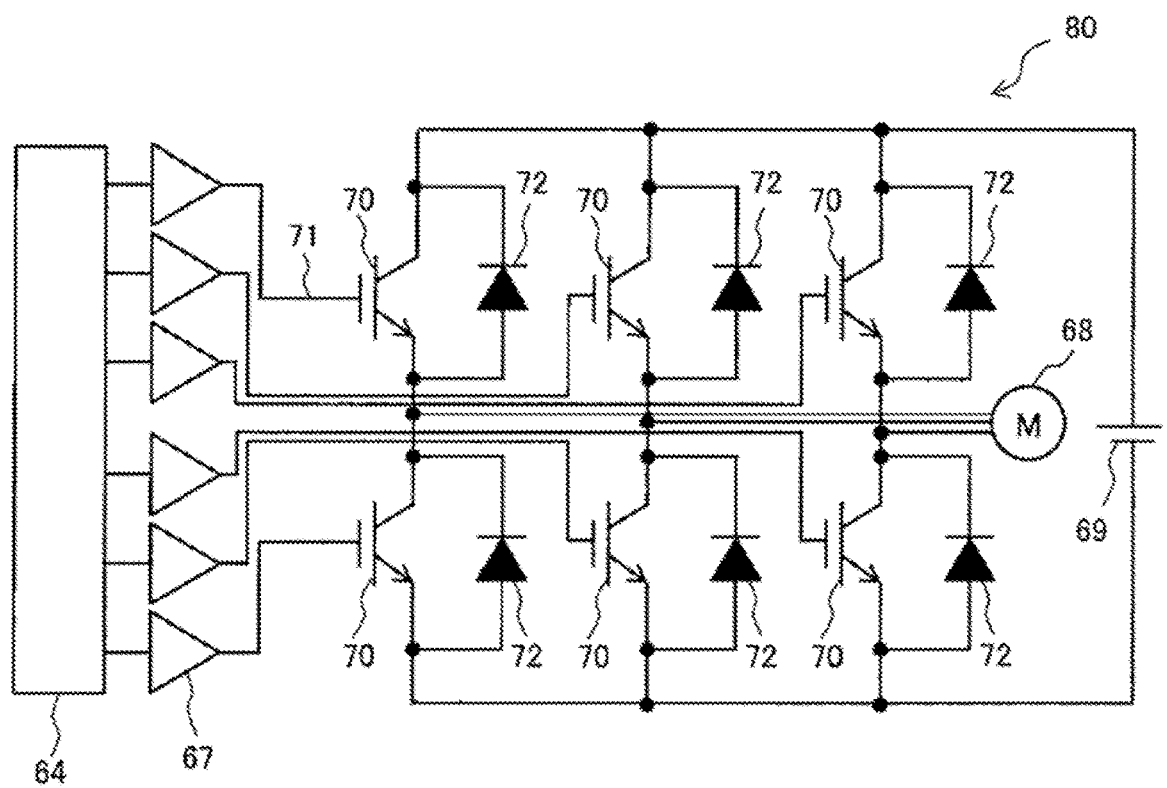
FIG. 26 is a diagram showing an example of a partial circuit diagram of a general inverter in the related art.

FIG. 25 is a diagram showing an example of a circuit configuration of a power conversion device 802 according to the second modification of the eighth embodiment of the invention. A configuration of the power conversion device 802 according to the present modification is substantially the same as a configuration of the power conversion device 800 according to the eighth embodiment except for the following points. That is, the pn joint diodes 66 are respectively connected in antiparallel to the IGBTs 76 in the power conversion device 800 according to the eighth embodiment while insulated gate control diodes 82 are connected to the IGBTs 76 in the present modification.

Each of the insulated gate control diodes 82 includes a control gate 83, and can control a carrier concentration during conduction or switching by a voltage applied to the control gate 83. Signals applied to control gates are generated at different timings by the control circuit 64, and are supplied via the drive circuits 67. Since a current and a voltage during conduction or switching of the insulated gate control diodes 82 can be dynamically controlled, a loss can be further reduced as compared with a case in which the pn joint diodes 66 are used.

Other than the insulated gate control diodes 82 as described above are used, an operation and a function of the power conversion device 802 according to the present modification are substantially the same as those of the power conversion device 800 according to the eighth embodiment. Therefore, similar to the power conversion device 800 according to the eighth embodiment, the power conversion device 802 according to the present modification can also achieve a low power loss and high efficiency.

The invention is not limited to the embodiments and examples described above, and includes various modifications. For example, the above-described embodiments and examples have been described in detail for easy understanding of the invention, and the invention is not necessarily limited to those including all the configurations described above. Apart of a configuration of one embodiment or one example can be replaced with a configuration of another embodiment or another example, and the configuration of another embodiment or another example can be added to the configuration of the one embodiment or the one example. In addition, a configuration included in another embodiment or example may be added to, deleted from, or replaced by a part of a configuration of each embodiment or example.

REFERENCE SIGN LIST

1, 1A, 1B n⁻ type drift layer
2 p type well layer
3 n type emitter region
4, 4A, 4B p type collector layer
5 gate insulation film
6a, 6b gate electrode
7 emitter electrode
8 collector electrode
12 p type power supply layer
13a, 13b gate electrode
15 p type region
16 insulation film
16a trench
23 conducting period
24 period right before turn-off
25 turn-off period
40, 41 metal wire
42 contact layer
45 non-conducting period
46 turn-on period
51, 51a, 51b, 51c, 51d, 51e IGBT having low ON voltage (first semiconductor element)
52, 52a, 52b, 52c, 52d, 52e dual gate IGBT having high ON voltage (second semiconductor element)
56, 77, 91 Gs gate (third gate electrode)
57, 78, 92 Gc gate (first gate electrode and second gate electrode)
64 control circuit
67 drive circuit
68 inductive load
69 direct current power supply
70 IGBT
71 insulated gate terminal
72 diode
76 IGBT (semiconductor devices 100, 200, 300, 400, 401, 500, 600)
80 inverter
81 Schottky barrier diode
82 insulated gate control diode
83 control gate
98 diode
99 insulation substrate
100, 200, 300, 400, 401, 500, 600 semiconductor device
101, 101a, 102 IGBT
105 conductive thin film
106, 108 emitter electrode
107, 109 collector electrode
110 anode electrode 111 cathode electrode
800, 801, 802 power conversion device

The invention claimed is:
1. A semiconductor device comprising:
a first semiconductor element; and
a second semiconductor element, the first semiconductor element and the second semiconductor element being connected in parallel, wherein
the first semiconductor element includes
   a first drift layer of a first conductive type that is formed on a first semiconductor substrate,
   a first well region of a second conductive type that is in contact with the first drift layer and formed at a first surface side of the first semiconductor substrate,
   first gate electrodes that are provided in a plurality of trenches formed at the first surface side of the first semiconductor substrate and passing through the first well region such that the first gate electrodes are in contact with the first drift layer and the first well region via gate insulation films,
   a first emitter region of a first conductive type that is formed on a part of a surface of the first well region interposed between the first gate electrodes such that the first emitter region is in contact with the first gate electrodes via the gate insulation films,
   a first channel region of a second conductive type that is formed on a surface of the first well region facing the first gate electrodes via the gate insulation films,
   a first emitter electrode in which the first emitter region and the first well region are electrically connected,
   a first collector layer of a second conductive type that is in contact with the first drift layer and formed at a second surface side of the first semiconductor substrate, and
   a first collector electrode that is electrically connected to the first collector layer,
the second semiconductor element includes
   a second drift layer of a first conductive type that is formed on a second semiconductor substrate,
   a second well region of a second conductive type that is in contact with the second drift layer and formed at a first surface side of the second semiconductor substrate,
   gate electrode sets each including a second gate electrode and a third gate electrode that are respectively provided in every two adjacent trenches among a plurality of trenches formed at the first surface side of the second semiconductor substrate and passing through the second well region such that the second gate electrode and the third gate electrode are in contact with the second drift layer and the second well region via gate insulation films,
   a second emitter region of a first conductive type that is formed at a part of a surface of the second well region interposed between the second gate electrode and the third gate electrode that belongs to the same set among the gate electrode sets such that the second emitter region is respectively in contact with the second gate electrode and the third gate electrode via the gate insulation films,
   a second channel region of a second conductive type that is formed on a surface of the second well region facing the second gate electrode via the gate insulation films,
   a third channel region of a second conductive type that is formed on a surface of the second well region facing the third gate electrode via the gate insulation films,
   a second emitter electrode in which the second emitter region and the second well region are electrically connected,
   a second collector layer of a second conductive type that is in contact with the second drift layer and formed at a second surface side of the second semiconductor substrate, and
   a second collector electrode that is electrically connected to the second collector layer,
the first emitter electrode of the first semiconductor element and the second emitter electrode of the second semiconductor element are electrically connected with each other,
the first collector electrode of the first semiconductor element and the second collector electrode of the second semiconductor element are electrically connected with each other,
a first gate electrode of the first semiconductor element and the second gate electrode of the second semiconductor element are electrically connected with each other, and
a voltage required to cause a predetermined current to flow in the first semiconductor element is smaller than a voltage required to cause the predetermined current to flow in the second semiconductor element.

2. The semiconductor device according to claim 1, further comprising:
a first state in which
   a voltage is applied to the first gate electrode of the first semiconductor element and the second gate electrode of the second semiconductor element so that inversion layers are formed in both the first channel region of the first semiconductor element and the second channel region of the second semiconductor element, and
   a voltage is applied to the third gate electrode of the second semiconductor element so that an inversion layer is formed in the third channel region of the second semiconductor element; and
a second state in which
   a voltage is applied to the first gate electrode of the first semiconductor element and the second gate electrode of the semiconductor element so that no inversion layer is formed in both the first channel region of the first semiconductor element and the second channel region of the second semiconductor element, and
   a voltage is applied to the third gate electrode of the second semiconductor element so that an inversion layer is formed in the third channel region of the second semiconductor element, wherein
a voltage required to cause the predetermined current to flow in the semiconductor device in the first state is smaller than a voltage in the second state.

3. The semiconductor device according to claim 2, further comprising:
a third state in which
   a voltage is applied to the first gate electrode of the first semiconductor element and the second gate electrode of the second semiconductor element so that no inversion layer is formed in both the first channel region of the first semiconductor element and the second channel region of the second semiconductor element, and a voltage is applied to the third gate electrode of the second semiconductor element so that no inversion layer is formed in the third channel region of the second semiconductor element, wherein when the semiconductor device transitions from a conducting state to a non-conducting state, the semiconductor device transitions in order of the first state, the second state, and the third state.

4. The semiconductor device according to claim 3, wherein an impurity concentration in the first collector layer of the first semiconductor element is higher than an impurity concentration in the second collector layer of the second semiconductor element.

5. The semiconductor device according to claim 3, wherein a carrier lifetime in the first drift layer of the first semiconductor element is longer than a carrier lifetime in the second drift layer of the second semiconductor element.

6. The semiconductor device according to claim 4, wherein an interval between two of the first gate electrodes that sandwich the first well region of the first semiconductor element is smaller than an interval between one of the first gate electrodes and another first gate electrode adjacent to the one of the first gate electrodes, and an interval between the second gate electrode and the third gate electrode that sandwich the second well region of the second semiconductor element is smaller than an interval between the second gate electrode and another second gate electrode adjacent to the second gate electrode, and smaller than an interval between the third gate electrode and another third gate electrode adjacent to the third gate electrode.

7. The semiconductor device according to claim 6, wherein the second gate electrode of the second semiconductor element is in contact with a side wall of one of the trenches, one surface of one second gate electrode is adjacent to the second well region, and the other surface at an opposite side of the second gate electrode is adjacent to an insulation film instead of the second well region, and the third gate electrode of the second semiconductor element is in contact with a different side wall of one of the trenches, one surface of one third gate electrode is adjacent to the second well region, and the other surface at an opposite side of the third gate electrode is adjacent to an insulation film instead of the second well region.

8. The semiconductor device according to claim 7, wherein the first gate electrode of the first semiconductor element is in contact with a different side wall of one of the trenches, one surface of one first gate electrode is adjacent to the first well region, and the other surface at an opposite side of the first gate electrode is adjacent to an insulation film instead of the first well region.

9. The semiconductor device according to claim 7, wherein the first gate electrode of the first semiconductor element, the second electrode of the second semiconductor element, and the third gate electrode of the second semiconductor element have a side wall shape in which a width increases from a first emitter electrode side and a second emitter electrode side towards a first collector electrode side and a second collector electrode side.

10. The semiconductor device according to claim 7, wherein when the semiconductor device transitions from the conducting state to the non-conducting state, a duration of the second state is 3 μs or longer.

11. The semiconductor device according to claim 7, wherein when the semiconductor device transitions from the non-conducting state to the conducting state, the semiconductor device transitions in order of the third state, the second state, and the first state.

12. The semiconductor device according to claim 11, wherein when the semiconductor device transitions from the conducting state to the non-conducting state, a duration of the second state is 0.5 μs or longer.

13. The semiconductor device according to claim 7, further comprising:

a diode that is a rectification element and connected in antiparallel to the semiconductor device.

14. The semiconductor device according to claim 13, wherein the diode includes an anode electrode on a first surface of a semiconductor substrate and a cathode electrode on a second surface of the semiconductor substrate, the cathode electrode is electrically connected with the first collector electrode of the first semiconductor element in the semiconductor device and the second collector electrode of the second semiconductor element on conductive thin films formed on a same insulation substrate, and the first semiconductor element and the second semiconductor element are disposed at two sides of the diode so as to sandwich the diode.

15. A power conversion device comprising:

a pair of direct current terminals;

a direct and alternating current conversion circuit in which two current switching elements that turn on or turn off a current are connected in series between the direct current terminals; and an alternating current terminal that is connected to a position where at least two semiconductor elements of the direct and alternating current conversion circuit are connected, wherein the current switching elements are the semiconductor device according to claim 1.

* * * * *